United States Patent [19]

Shutterly

[11] 4,295,223
[45] Oct. 13, 1981

[54] DIGITAL SIGNAL/NOISE RATIO AMPLIFIER APPARATUS FOR A COMMUNICATION SYSTEM

[75] Inventor: Harold B. Shutterly, Pittsburgh, Pa.

[73] Assignee: Westinghouse Electric Corp., Pittsburgh, Pa.

[21] Appl. No.: 33,064

[22] Filed: Apr. 25, 1979

[51] Int. Cl.³ .......................... H04B 1/64; H04N 7/16
[52] U.S. Cl. .................................. 455/72; 179/1.5 R; 333/14; 358/121; 358/145; 358/147; 370/7
[58] Field of Search ......................... 325/62; 333/14; 179/15 AV, 1.5 R, 1.5 S; 358/121, 116, 145, 147; 455/72

[56] References Cited

U.S. PATENT DOCUMENTS

| 2,605,361 | 7/1952 | Cutler | 179/15 AV |
| 3,241,066 | 3/1966 | Ligotky | 333/14 |
| 3,496,468 | 2/1970 | Kaneko et al. | 333/14 |
| 3,500,206 | 3/1970 | Kaneko et al. | 325/62 |
| 3,773,977 | 11/1973 | Guanella | 179/1.5 S |
| 3,824,467 | 7/1974 | French | 325/32 |
| 3,902,007 | 8/1975 | Justice | 358/145 |
| 4,070,693 | 1/1978 | Shutterly | 358/122 |
| 4,156,253 | 5/1979 | Steudel | 358/145 |

OTHER PUBLICATIONS

C. J. Kikkert; IEEE Transactions on Communications, Jan. 1974, p. 75.
J. C. Rogers et al.; IEEE Transactions on Communications, vol. Com-26, No. 6, Jun. 1978.

Primary Examiner—S. C. Buczinski
Attorney, Agent, or Firm—C. M. Lorin

[57] ABSTRACT

The signal-to-noise ratio of a signal to be transmitted through a communication channel having an upper and lower limit in magnitude is sampled digitally and a common corrective factor for the deviations about the mean value of the signal is determined for amplifying the low portions of the signal without exceeding the limits. By a reverse process at the receiving end of the communication channel, the signal is returned to its original amplitude, thus reducing any noise superposed in the transmission.

The invention is applicable to a video channel where the sampled signal is an audio signal. In such case, the deviations of the samples about the mean of the digital information of the audio signal are matched with the mean of the video channel between the black level and the maximum white level.

5 Claims, 16 Drawing Figures

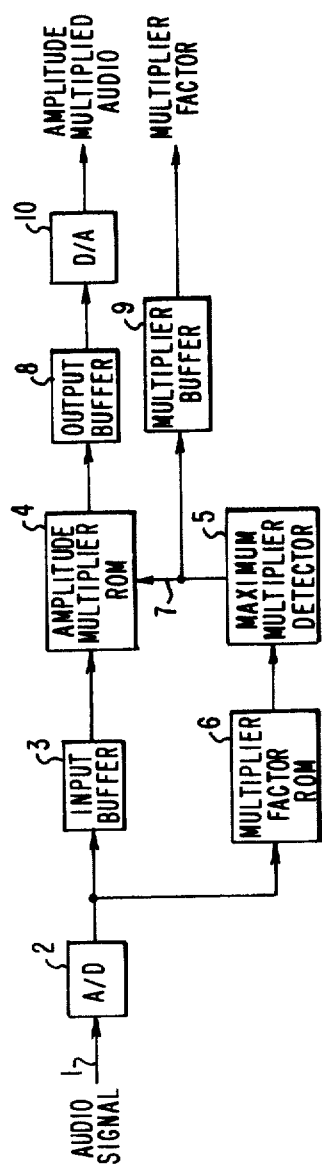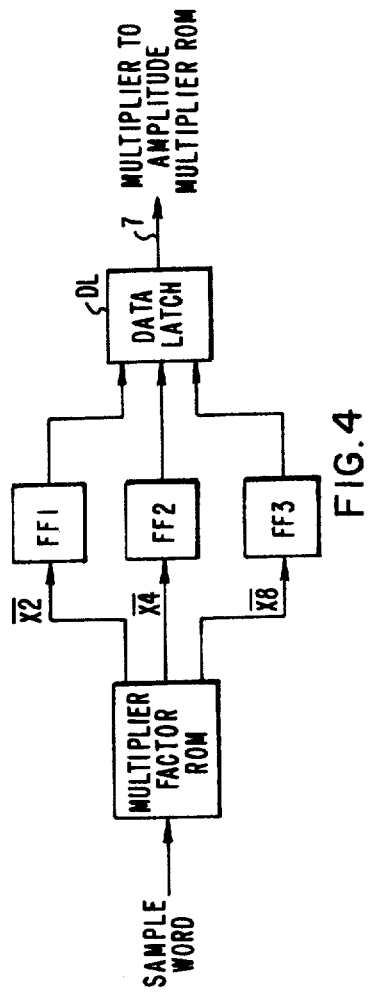

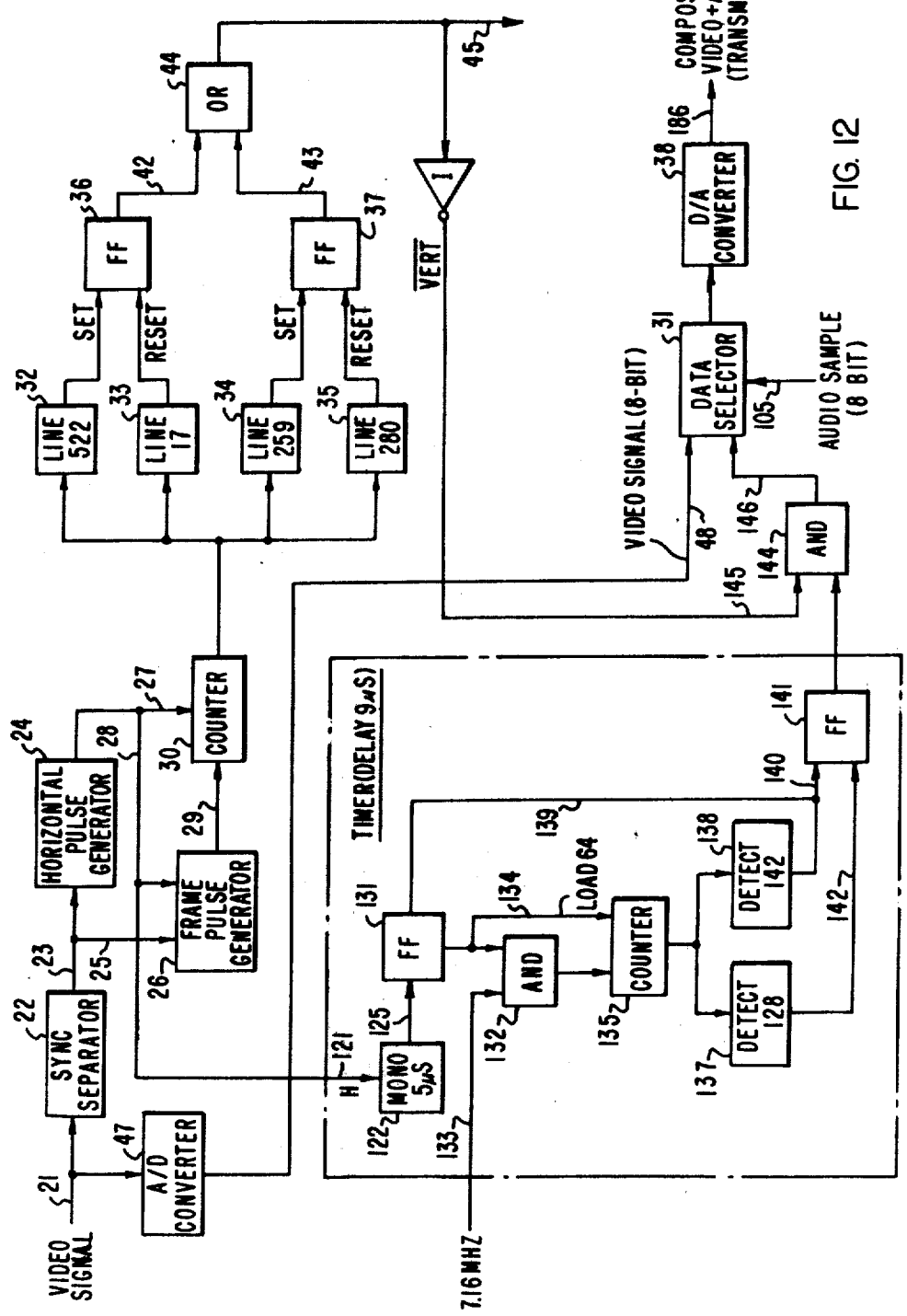

DIGITAL SIGNAL/NOISE RATIO AMPLIFIER APPARATUS FOR A COMMUNICATION SYSTEM

BACKGROUND OF THE INVENTION

A compander is defined as "a system for improving the signal-to-noise ratio by compressing the volume range of the signal at a transmitter by means of a compressor, and restoring the normal range at the receiving apparatus with an expandor." (See Electronics and Nucleonics Dictionary/John Markus - McGraw Hill Co. (1966).

The companding technique for noise reduction in communication channels is well known. Compression is applied at the input of a communication channel and expansion follows at the receiving end, thus after noise exposure in the communication channel. This method is used in particular for improvement of the signal-to-noise ratio over a voice circuit so that operation becomes possible over noisy circuits. The method consists in imparting more gain to low-intensity signals, e.g., those most affected by the noise, than to high-intensity signals. This reduces the dynamic range of the signals being transmitted.

The invention proposes to effect noise reduction in a somewhat different communication problem, as explained, in copending patent application Ser. No. 033,063 filed concurrently by Harold B. Shutterly, where audio signals are transmitted as part of the video signals of a standard television system. In such situation, while the audio signals are multiplexed into the blanking periods of the video signals for transmission over video channels, the video channel signal-to-noise ratio is frequently too low for the audio signal. The principal reason for requiring a higher signal-to-noise ratio for audio than for video is to prevent audible noise during low-level portions of the audio signal. According to the present invention, the amplitude of the audio signals is increased to a maximum extent before transmission and then decreased by precisely the same factor after reception. This is made possible by an auxiliary control code transmitted with the audio signal. Decreasing the signal amplitude after reception also decreases any added noise by the same factor, thereby effectively increasing the signal-to-noise ratio of the transmission channel for the low-level signals.

SUMMARY OF THE INVENTION

In a communication system for transmitting a signal f(t) as a function of time (t), provision is made for (1) subtracting from the signal a value M representing the mean of the signal to be transmitted, (2) multiplying the absolute value $[f(t)-M]$ (which represents the signal deviation from the mean) by a coefficient, or corrective factor, K which is a constant for a given length of time, such as to maximize the magnitude of the signal within the constraints of the communication channel, (3) transmitting a signal which is $K[f(t)-M]+M$ obtained by adding back the value of the mean, and (4) transmitting the value K as an auxiliary code signal. At the receiver end, the reverse procedure consists in (1) subtracting M to derive $K[f(t)-M]$, (2) dividing the result by K, thereby reducing the effect of the noise acquired during the transmission, and (3) adding M again, thereby recovering f(t) as a faithful representation of the original signal.

BRIEF DESCRIPTION OF THE DRAWINGS

FIG. 3 shows, in block diagram, circuitry to augment the signal shown in FIG. 2 before the transmission;

FIG. 4 is illustrative of circuitry for the determination of the maximum multiplier that can be used within the limits $P_1$, $P_2$ of FIG. 2;

FIG. 12 shows circuitry of the television system coupled with the insertion circuitry of the audio scrambler of FIG. 9;

PRESENTATION OF THE INVENTION AGAINST THE BACKGROUND OF A COMPANDER AS PRIOR ART

Figure 1:
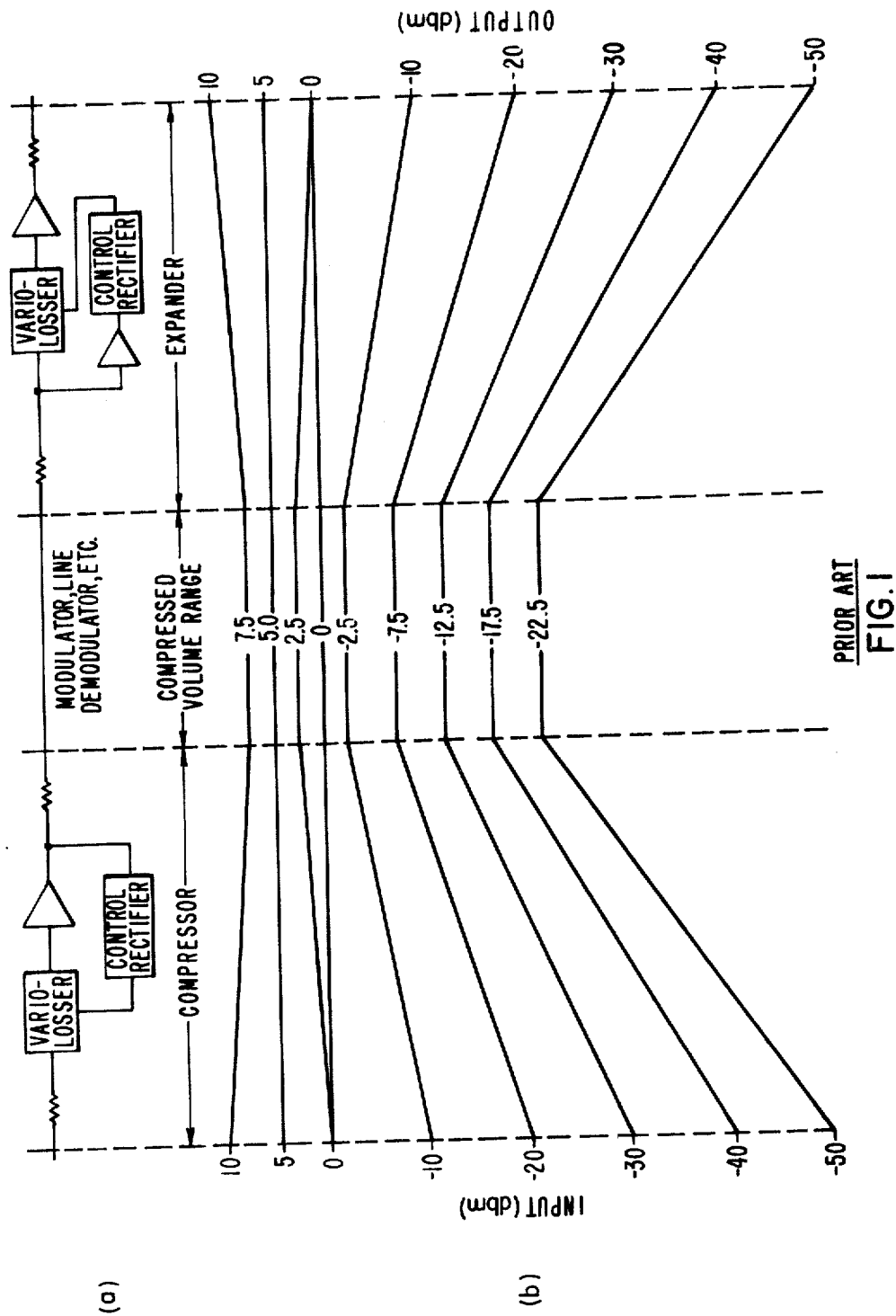
FIG. 1 shows under (a) a compander of the prior art and, under (b), its effect on the power levels of the signal being transmitted and received at both ends of a communication channel.

In a compander, as shown in FIG. 1, compression at the transmitter reduces the dynamic range of the audio levels in decibels. The low levels are given an additional gain which brings them closer to the high levels. Nevertheless, the lowest level signals are still 30 decibels below the highest level signals (1000 to 1 power ratio). Expansion at the receiver end restitutes the initial proportion between audio levels, while attenuating any noise or cross talk which could have been added to the lower level signals during the transmission. The compression stage may be considered as causing a multiplication applied to the different levels with a different multiplier for each, and the expansion at the receiver side may be seen as a division with a divisor which also differs between levels, although each is the same as the corresponding multiplier. Also, the multiplication pattern is predetermined for the entire transmission period, just like the division pattern.

In contrast, as will be explained by reference to FIG. 2, the invention proposes a maximum multiplier for each section of signal being transmitted, such maximum multiplier being adjusted from time to time in order to maximize the excursion of the signal from its mean without exceeding predetermined upper and lower limits $P_1$, $P_2$. Moreover, information regarding the applied multiplier is transmitted together with the signal, so that the divisor at the receiver end can be applied and adjusted accordingly. Thus the highest and lowest level input signals may be transmitted at the highest power level.

Figure 2:
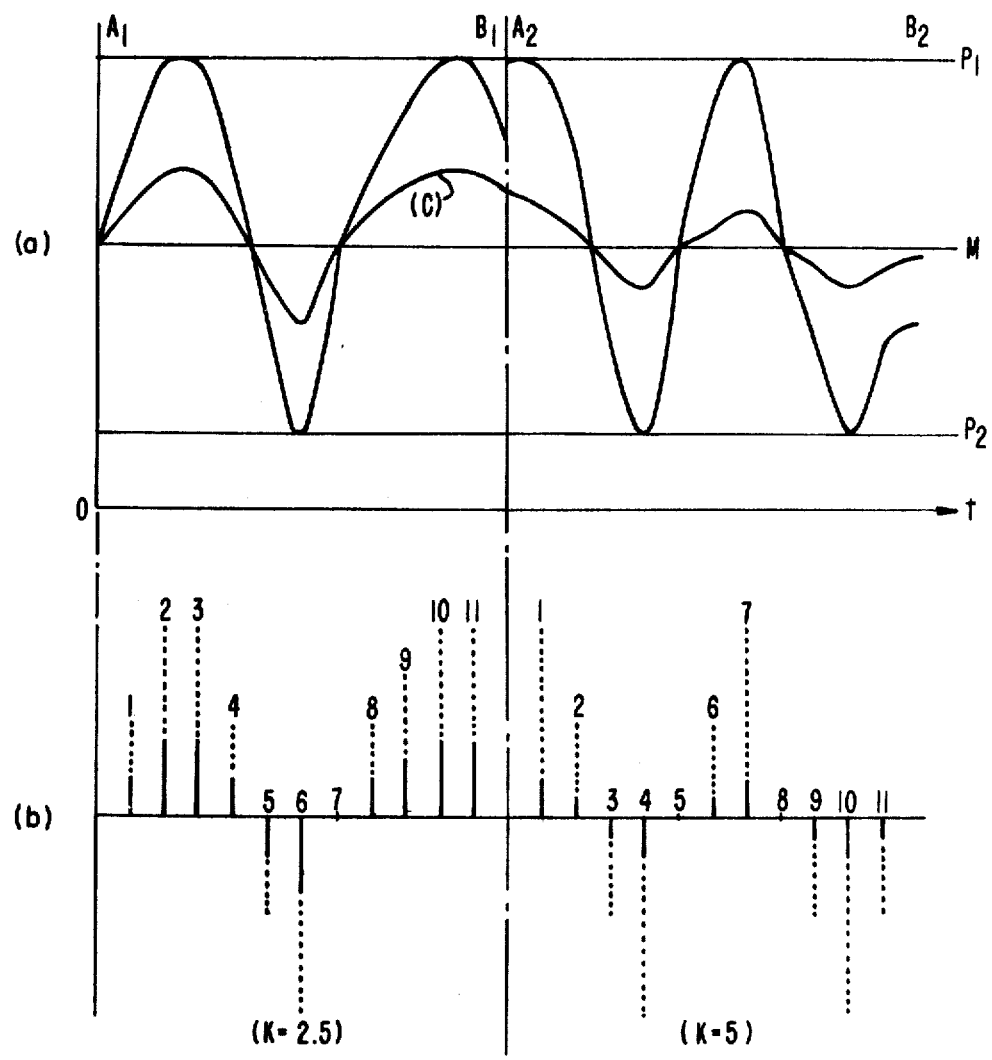
FIG. 2 shows by curves (a) and (b) how, according to the present invention, two successive segments of a continuous signal are amplified for transmission so that they may reach, without exceeding it, either of an upper and a lower limit $P_1$, $P_2$ on two opposite sides from the mean of the signal.

FIG. 2 shows under (a) two consecutive segments $A_1B_1$, $A_2B_2$ of a continuous signal (c). This signal deviates about a mean value shown by a straight line M. Curve (b) shows eleven samples of the deviation of signal (c) from the mean M. It is proposed to amplify signal (c) so that it reaches, without exceeding either of two limits $P_1$, $P_2$ which are considered more favorable for transmission through a given communication channel. In the example, for segment $A_1B_1$, a coefficient of magnification $K=2.5$ is applicable. K is equal to 5 when computed for segment $A_2B_2$. Under (a) the magnified signal appears as it will be transmitted. At the receiver end, the divisor would be $D=2.5$ for segment $A_1B_1$ and $D=5$ for segment $A_2B_2$.

Typically, in the aforementioned copending patent application the signal is an audio signal which is transmitted as part of a video signal, line-per-line. In such instance, the lower level $P_2$ corresponds to the blanking level of the video signal, while $P_1$ is the maximum level acceptable for the video signal.

The invention is susceptible of many other applications though. For instance, K is not necessarily larger than one, because it is conceivable that if signal (c) is larger than $P_1$ and/or $P_2$, it needs to be reduced in magnitude before transmission, in order to be contained between those two limits and maintained as close as possible to such limits. Also, the signal need not necessarily be an audio signal, nor need it be transmitted as part of a video signal.

The invention will now be explained in the context of an audio signal to be transmitted after digital treatment. In this respect, FIG. 2 provides curves (a) and (b) for the purpose of illustration.

FIG. 3 is a block diagram of the audio amplitude multiplier apparatus. An audio signal inputted on line 1 is sampled by A/D converter 2 at a uniform rate above the Nyquist limit, and each sample so derived is converted into a digital word and stored into an input buffer 3.

While the buffer is being filled, each word from the A/D converter 2 is used as the address to a Multiplier Factor ROM (read-only-memory) 6. The output of ROM 6 indicates for each sample the largest factor by which its amplitude can be multiplied without exceeding the peak-to-peak amplitude limits $P_1$, $P_2$ of the transmission channel. If, for example, the A/D converter 2 provides 8-bit output words, then, there are 256 possible outputs, and the ROM would contain the largest multiplier for each of these outputs. The set of possible amplitude multipliers can include any factor, but for many applications binary multipliers such as 1, 2, 4 and 8 should be sufficient.

The amplitude of each sample is the difference between the signal value and the mean audio level M. Assume, for example, that the binary output of the A/D converter ranges between 0 and 255 (decimal) with 128 being the mean output. Then, an output of 148 has an amplitude of 20, and an output of 100 has an amplitude of $-28$, etc. The maximum positive amplitude is $255-128=127$, and the maximum negative amplitude is $0-128=-128$.

As the input buffer 3 is being loaded with samples, and corresponding multiplier factors are derived from the ROM 6, the maximum multiplier for the entire group of samples present in buffer 3 is determined by a maximum multiplier detector 5. If most of the samples loaded into the buffer at a particular time have amplitudes that can be multiplied by 8, but some can only be multiplied by 4, then detector 5 will select 4 as the maximum multiplier.

The word capacity of the input buffer 3 determines the number of samples that receive the same multiplier. This number might be specified anywhere in the range from 10 to 500, depending on transmission channel conditions and listening requirements. The smaller the number, the greater the signal-to-noise ratio improvement, but also the greater the number of multiplier factors that have to be transmitted over the communication channel with the audio.

The maximum multiplier can be determined quite simply as indicated in FIG. 4. The multiplier factor ROM 6 has separate outputs, one for each multiplier factor. As each sample word addresses the ROM, an output signal is provided for any multiplier factor that is too large for that particular sample. Assumimg three such outputs, the outputs set respective flip-flops FF1, FF2, FF3, which were in the reset state at the beginning of the new loading period of the input buffer. At the end of such buffer loading period, the highest multiplier that has not set a flip-flop is the maximum for that group of samples.

The states assumed by the flip-flops when the input buffer loading period is completed are stored in a latch DL. The latch outputs enable a section of the amplitude multiplier ROM 4 that provides the proper amplitude multiplication. For example, assume that the sample words stored in the input buffer 3 are 8-bit words, and therefore have 256 possible values, and that there are four possible multipliers: 1, 2, 4, and 8. Then, the amplitude multiplier ROM 4 must contain one section of 256 words that correspond directly with the input words, one section of 127 words that have amplitudes multiplied by 2, one section of 63 words that have amplitudes multiplied by 4, and one section of 31 words that have amplitudes multiplied by 8. The polarities of the sample amplitudes are, of course, not changed by the multiplication process.

As one group of samples is read into the input buffer, the previously stored group is read-out, multiplied by the amplitude multiplier ROM, and stored into the output buffer. The capacity of the output buffer may be several times larger than that of the input buffer, since its function is to store the samples until they can be multiplexed into the video signal. The multiplier buffer 9 stores the multiplier factors that are associated with the sample groups stored in the output buffer.

Figure 5:
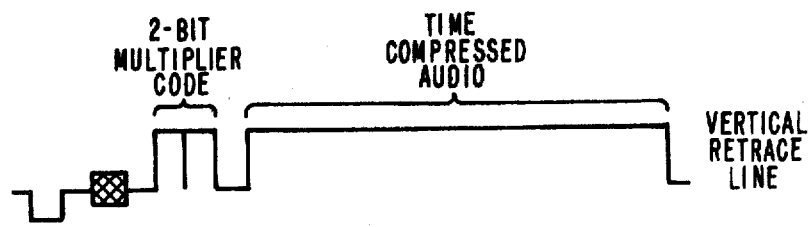
FIG. 5 illustrates the transmission of a series of digital samples belonging to an audio segment compressed for insertion within the vertical retrace line of a television system. The transmission is made, after amplification of the samples, together with a coded indication of the multiplier used.
Figure 6:
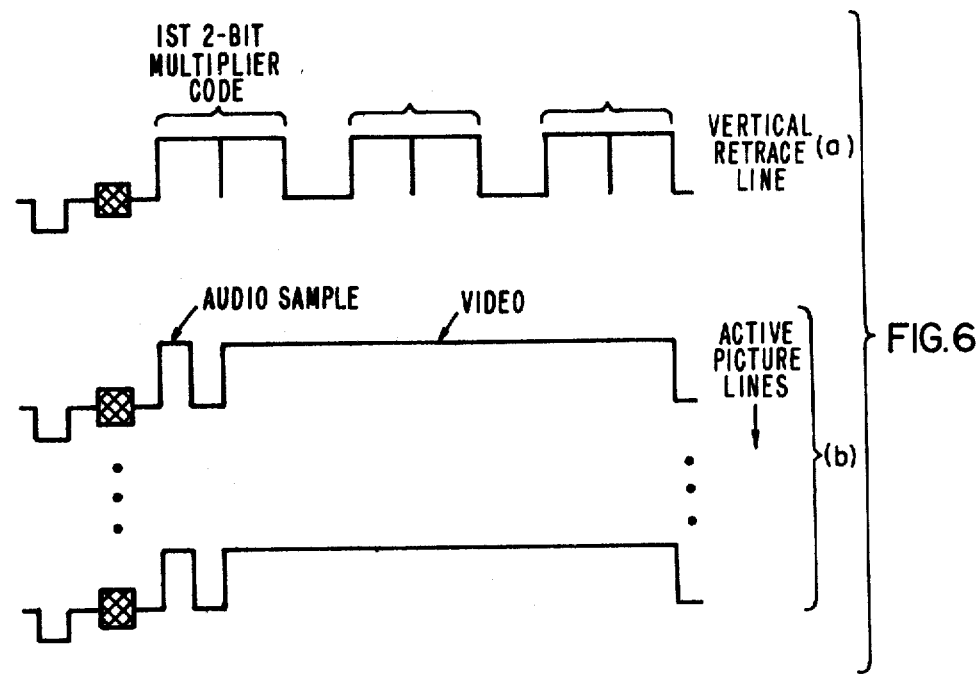
FIG. 6 shows a series of separate audio samples distributed between video lines, the vertical retrace line being used to transmit a coded indication of the various multipliers used before transmission for the respective samples.

FIGS. 5 and 6 indicate two possible associations of a multiplexed audio signal with video signals. In FIG. 5, the audio signal and multiplier factor are transmitted together in one of the vertical retrace lines of the video. The multiplier factor is read out of the multiplier buffer as a serial binary code and inserted into the video line just after the color burst. The associated group of audio samples is then read out of the output buffer at high speed and inserted into the active portion of the retrace line. One or more of such groups of audio samples can be transmitted in this fashion, one group in each line of the vertical interval of the video signal.

In FIG. 6, several multiplier factors (see curve (a)) associated with respective groups of audio samples are inserted together into a vertical retrace line. The audio samples (see curve (b)) are inserted as single samples in separate video lines following the color bursts during the active picture lines.

At the receiver the audio samples and multiplier factors are demultiplexed from the video, and the sample amplitudes are divided by the received multiplier factor.

Figure 7:
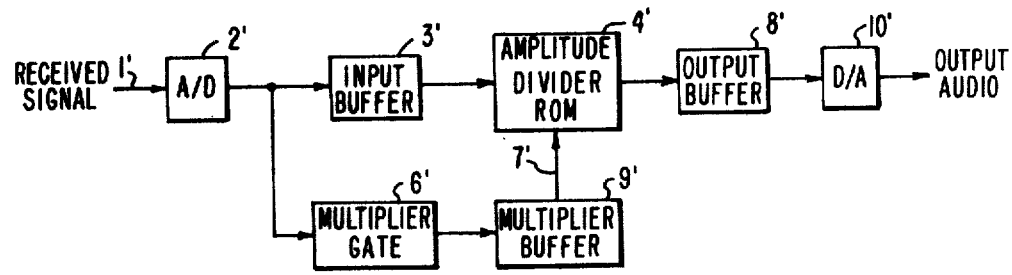
FIG. 7 shows, in block diagram, circuitry to divide the signal at the receiving end of the communication channel in accordance with the circuitry of FIG. 3.

FIG. 7 schematically shows the audio recovering process at the receiver end. The received samples are converted to digital by A/D converter 2' and stored into an input buffer 3' that groups together all of the samples that are to be divided by a common multiplier factor. The multiplier factors are gated by 6' into a multiplier buffer 9' and used via 7' to select the correct portion of the amplitude divider ROM 4', while the samples are being read out of the input buffer 3', and stored into the output buffer 8'. The operation is essentially the same as occurred at the transmitter end, except that the sample amplitudes, (and any noise picked up during transmission) are now divided instead of being multiplied. The samples are then read-out of the output buffer 8' at the same uniform rate used to sample the inputted audio signal when transmitting. D/A conversion and filtering then complete the process of audio signal reproduction.

It should be noted that this amplitude multiplication-division technique when applied to the transmission of audio over digital transmission channels, can be used to reduce the number of bits per sample that are necessary for transmission.

For example, the 10-bit words from a 10-bit A/D converter could be transmitted only as 8-bit digital words. This is due to the fact that for quiet portions of the audio signal the multiplication process actually moves the digital information for the 9th and 10th bit positions into the more significant bit positions. Thus, truncating the 10 bit words to 8 bits does not affect the information relative to quiet portions of the audio. At the receiver, the division process returns the information relative to quiet portions of the audio to the 9th and 10th positions. As a result, it is possible to use a 10-bit D/A converter and still minimize the quantizing noise in the quiet portions of the audio output.

This technique effectively decreases the channel signal-to-noise ratio requirements needed to transmit analog audio signals and thereby permits audio signals to be transmitted during the blanking intervals of television signals.

Signal processing, since it is done in digital form can be very precise and quite reproducible. This does not involve non-linear operations so that beat frequencies are not generated and no alteration takes place in the audio bandwidth.

At the receiver, the reverse process does not depend upon any measurement to be performed on the audio signal, which could be in error if noise is being picked up during transmission.

DESCRIPTION OF THE PREFERRED EMBODIMENT

Apparatus has been designed for concurrently performing within a television system the following operations:

sampling of a continuous audio signal;
scrambling of the derived samples; and
inserting into each video line at least one of the scrambled samples.

The operations are achieved in synchronism with the occurrence of the video lines, and the insertion is effected within a non-occupied portion of each transmitted video signal.

Figure 8:
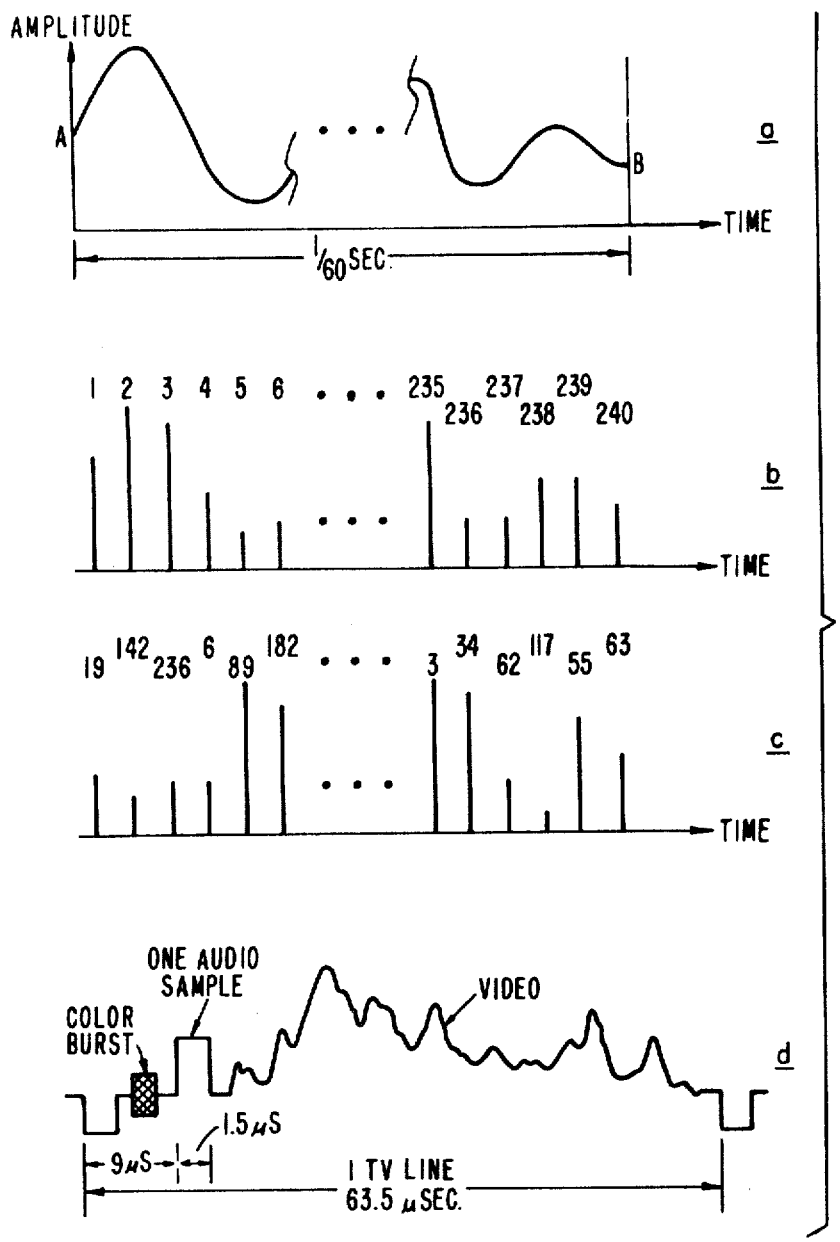
FIG. 8 shows curves which are typical (a) of a segment of audio signal; (b) of the derived audio samples; (c) of the scrambled samples; and (d) of a video signal after insertion of one audio sample.

Referring to FIG. 8, curve (a) shows a segment of audio signal AB, which is 1/60 sec. long. Curve (b) indicates 240 audio samples derived from the segment AB of audio under (a). Curve (c) represents scrambled samples derived after curve (b). Curve (c) shows one audio sample inserted at the beginning of a video line already including a synchronizing pulse and a color burst. The displayed portion of the video signal lasts approximately 50 microseconds and follows a 12 microseconds interval, including the 4.7 $\mu$sec. synchronizing pulse signal and the color burst, which occupy a 9 microsecond interval. It appears from curve (d) that a three microsecond interval is available for the insertion into the video line of at least one scrambled sample, in accordance with the present invention.

Figure 9:
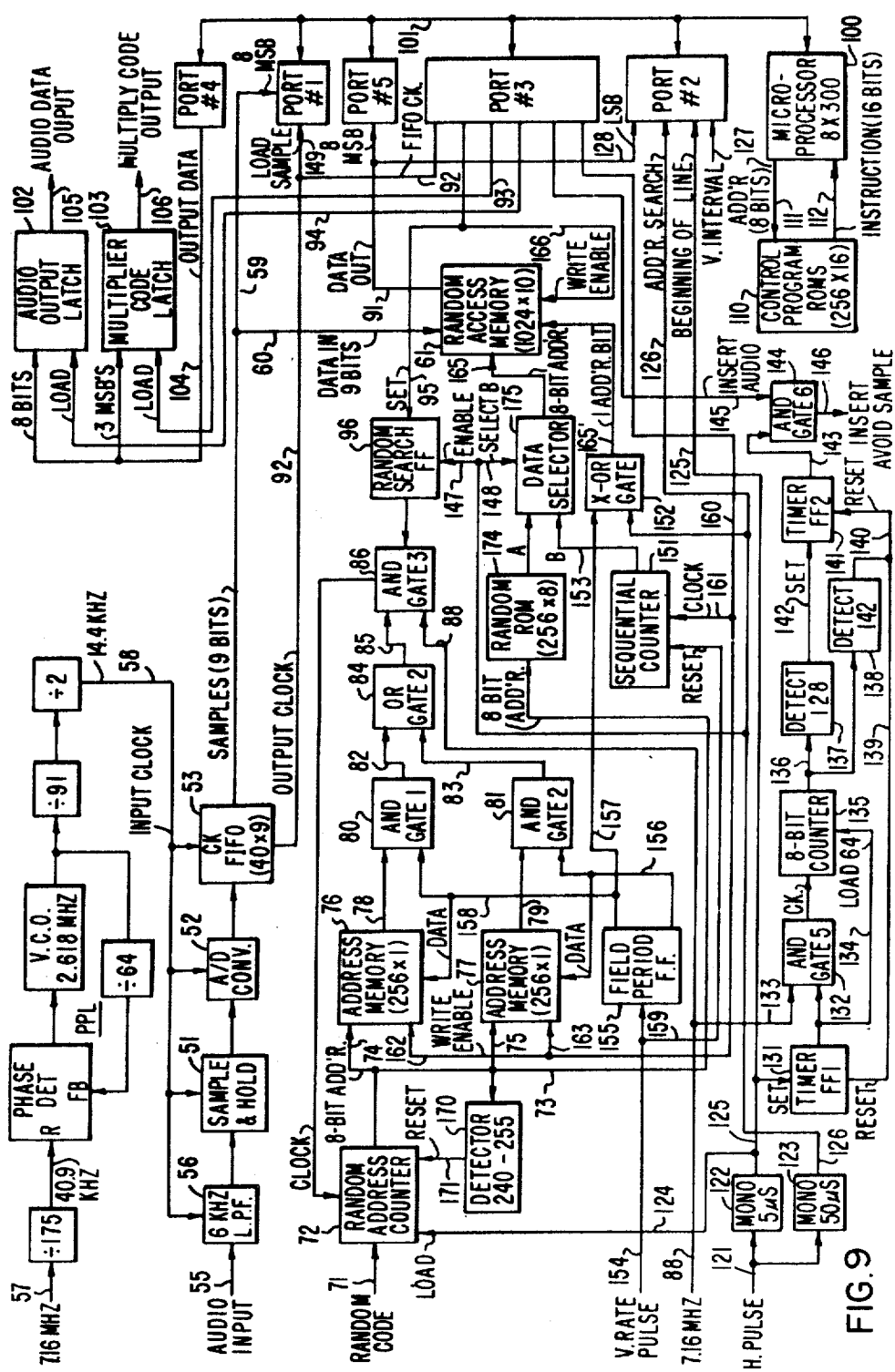
FIG. 9 is the audio scrambler used at the transmitter side of a television system.

Referring to FIG. 9, it will now be shown (1) how the audio signal segment AB, received on line 55, is being sampled; (2) how the derived samples are being scrambled; and (3) how the insertion of a scrambled sample takes place in timing with the occurrence of an available space within a video line.

The circuit of FIG. 9 comprises the following sections:

An audio sampling section centered around the phase locked loop PLL and circuits 51, 52 which are a sample and hold circuit, and an analog-to-digital converter, respectively.

A sample scrambling section centered around random address counter 72 and random access memory 61. The samples from the audio sampling section are initially stored in a first in-first out (FIFO) memory 53, which operates as a buffer element between the sampling operation and the sequential ordering of the samples into RAM 61. Scrambling results from reading at random the samples stored into RAM 61. Sequential storing is effected when a data selector 175 is in mode B for addressing the RAM, while random reading is performed by addressing the RAM through data selector 175 in the mode A.

FIG. 9 includes also a timer section which is synchronized with a monovibrator 122 of 5 $\mu$s delay and a monovibrator 123 of 50 $\mu$s delay, both triggered by a horizontal pulse H at the rate of the video lines. The timer action establishes permissible and prohibited time intervals for stages of operation of the sample scrambling section in relation to the horizontal pulse and the field of scanning.

A clock signal of 7.16 MHz appears on line 88, for clocking the addressing process.

FIG. 9 also includes a microprocessing section centered around microprocessor 100 and control program ROM module 110. This section conditions the reading, scrambling and insertion operations within the permissible time intervals established by the timing section.

The interface between the video signals and audio samples for insertion and transmission is shown in FIG. 11.

The sample and hold circuit 51 of FIG. 9 receives the audio signal from line 55 through a 6 kHz low pass filter 56. The samples are converted into digital numbers by A/D converter 52, and such digital numbers are temporarily stored into a first-in first-out (FIFO) device 53, starting with the vertical blanking pulse. Device 53 is read out under control from line 92 on a first-in first-out basis (FIFO). Circuits 51, 52 and 53 are clocked from line 58 at a frequency of 14.4 kHz by a clock signal obtained from a phase-locked loop (PLL), itself fed with a 7.16 MHz signal from line 57.

The stored samples read continuously from FIFO device 53 to be stored sequentially (sequential counter 151 and data selector 175 in mode B) into a Random Access Memory (RAM) 61. RAM 61 is in two sections, alternately used for storing and reading like taught in U.S. Pat. No. 4,070,693 of Shutterly.

Typically A/D converter 52 is a solid state device known as DATEL EH10B providing 9 bits per sample. The FIFO device 53 is of the FAIRCHILD 3351 having 40×9 locations. The two RAM sections of circuit 61 are obtained from solid state devices known as F93415 RAMS each having: a data input pin 15 connected with one of the nine output terminals of the FIFO device (shown by lines 59 and 60); a data output pin 7 connected to one of the 8 inputs (line 91 in FIG. 9) of Port #5 and an input of Port #2; a 9-bit address (8 bits on line 165 from data selector 175, plus one most significant bit on line 165' from exclusive OR gate 152 for determining which of the two sections of the RAM is to be used) on pins 2–6, and 9–12.

RAM device 61 stores the samples received from line 60 in their natural order into locations defined by a Write-address received from sequential counter 151 and via line 153 from data selector 175, in the Write-mode (B). In order to effect scrambling, these samples, when readout, are extracted in a random fashion as given by the addresses from Random ROM 174 through data selector 175 in the Read-mode A. The way such randomness is achieved will now be described by reference to Random Access Counter 72 and Random ROM 174.

A random code on line 71 (from a standard pseudo-random sequence generator) causes Random Access Counter 72 to output on lines 73, 74 and 75 an 8-bit address which is at random. However, it is necessary to avoid true randomness, in that no location in the Random Access Memory 61 may be sought and used twice, and none may be omitted, since all the samples read out from FIFO 53 must be stored in and read out of the RAM, in whatever pseudo-random order. It is observed here that Random ROM 174 is responsive via line 73 to Random Address Counter 72 and that it outputs into RAM 61, when data selector 175 is in the A mode. Circuit 174 is used to dissociate the randomness of the audio scrambling from the randomness of the code of line 71 which may be used elsewhere, for instance for scrambling the video.

While using a different approach, the method of preventing repetitions or omissions in the address of line 73, is similar in concept to what is disclosed in U.S. Pat. No. 3,921,151 of Guanella. A distinctive feature is found, however, in the way two Address Memory devices 76, 77 are used as scratch pads, alternately, to store from 74 and 75, respectively, the random address proposed by circuit 72, on line 73. Alternation in the operation of devices 76, 77 is obtained by lines 158, 156, respectively, which have opposite binary bits. One memory stores, while the other is under erasure. The outputs 78, 79 from the memories are checked by AND devices 80, 81, respectively, against the bits of lines 158, 159. When a duplication occurs between the binary state to be stored and the binary state already at the location, AND gate 80 (or 81), OR gate 84 (by line 82, or 83) and, AND gate 86 (via line 85), pass the clock signal of line 88, thereby to clock and advance Random Access Counter 72. Random Access Counter 72 will thus be advanced to the next location each time a location is found to be already "occupied" as a result of a previously operative address, and such advance will be repeated until an "empty" location has been found.

Figure 10:
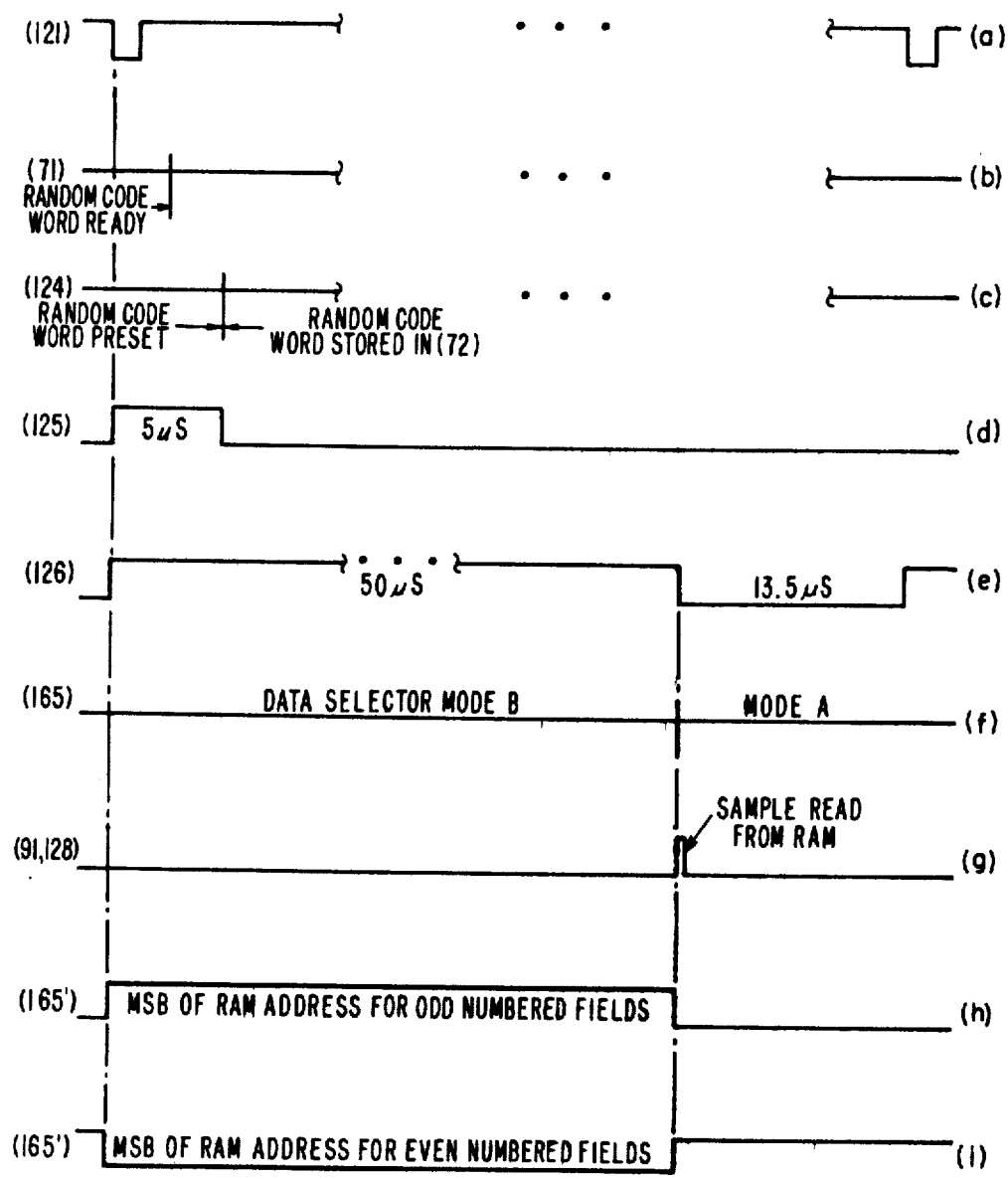
FIG. 10 shows with curves key instants established by the timer of FIG. 9 as used for storing, reading and latching of samples.

Referring to the curves of FIG. 10, the H-pulse of line 121 establishes on the front edge thereof an initial time from which a 5 μs delay (curve (d)) and a 50 μs delay (curve (e)) are generated by the respective monovibrators 122, 123 of FIG. 9. The random code number (which may be derived from a random generator used to scramble the video signals) is formed on line 71. It appears as an 8-bit word ready for setting counter 72 after a delay shown by curve (b). When the 5 μs delay has taken place (curve (d)), by line 124 the random number is stored into counter 72. For all the 240 lines of one field of scanning (one is the odd numbered lines, the other corresponds to the even numbered lines) as established by the vertical rate pulse of line 154 and the field period flip-flop 155, the most significant bit of the RAM address is determined and passed through Exclusive-OR gate 152 onto line 165'. The status of line 165 is shown by curves (h) or (i) of FIG. 10. Data selector 175 changes from the B mode into the A mode after 50 μs, by lines 126 and 148. As a result, as shown by curve (g) the sample indicated by the pseudo-random address is derived from lines 91 and 128 at the request of the microprocessor.

The insertion of a sample concurrently with the occurrence of a video line, requires consideration of the timer section of FIG. 9.

Timing for the insertion of the audio samples into the outgoing TV lines is determine by counting cycles of the 7.16 MHz clock of lines 88, 133 by reference to the beginning of each TV line as indicated by the H-pulse of line 121. The 5 μsec. monovibrator 122 sets a flip-flop Timer 131 to start clocking from line 133, via AND gate 132, an 8-bit Counter 135 which by line 134 has been initially set to count 64. Count 128 is detected at 137 to set a flip-flop timer 141, and count 142 is detected at 138 to reset the flip-flop timer 141, while resetting by line 139 the flip-flop timer 131. This results in opening by line 143 and AND gate 144 to produce on line 146 an Insert Audio signal. The timing of counter 135 and timer 141 establishes a window starting exactly 9 μs after the H-pulse, e.g., the window matches the unoccupied portion of the video line (see FIG. 8). Now, a sample latched in latch 102 of FIG. 9 is derived for insertion from output line 105, when the insertion is permitted by the window of line 146, as will be shown hereinafter.

As seen from microprocessor 100 through Ports #1 to #5, the control logic is as follows:

The outputted data on line 91 are passed through Port #5 onto the 8-bit data bus 101 of microprocessor 100. The sample after processing by the microprocessor is passed through Port #4 to be stored into audio output latch 102, as an 8-bit word. From there, as earlier mentioned, insertion takes place by line 105. The logic for enabling the insertion is by line 145 to AND gate 144, through Port #3. This decision takes into account the signal of line 125 which is indicative of an occurring video line and the signal of line 127 which is indicative of the vertical blanking space, both received through Port #2. Port #2 also receives the signal of line 126 which authorizes the address search, and informs the processor when to call for the sample of the RAM from lines 91 and 128. Port #3 transmits more commands from microprocessor 100. One of these is the address clock of line 160 for Address memories 76, 77, and sequential counter 151, by 161. Port #3, by lines 95 and 166, also causes clocking of the addresses in Random Address Counter 72 and writing at the addressed locations of the FIFO data from line 60. By line 92 the stored samples are clocked out of FIFO 53. Lines 93 and 94 load the multiplier code latch 103 and the audio output latch, respectively.

The feature used in accordance with the present invention for reducing noise in the transmission of the samples inserted by the audio scrambler, is centered around the microprocessor. The microprocessor calls, via Port #1 and line 59, for the samples stored in the FIFO circuit 53. These are treated digitally and logically by the microprocessor in accordance with the control program module 110. From an evaluation of the samples derived within 1/60 sec., (i.e., segment AB) which form a group to be scrambled by the Random Access Memory 61, the microprocessor establishes the peak signal limits and calculates a multiplication factor applied discriminately to the samples. This operation is gated via Port #1, by lines 92 and 149, and the result is a multiplied 8-bit sample and a 3-bit multiplier code which are passed by Port #4 onto line 104. The multiplier code is latched into multiplier code latch 103 to be sent on line 106 for transmission as a code to be used in reverse when a corrective factor will be applied to the audio data at the receiver end.

The overall scheme for audio sample scrambling and audio sample insertion in the video lines will now be explained in detail in the light of the foregoing considerations by reference to the elements of the circuitry of FIG. 9.

The scrambling of the audio signal is produced by sampling the input signal at a sufficiently high frequency (line 58) to preserve the signal content, and then transmitting the samples in a pseudo-random order. The audio signal is bandlimited to 6 kHz and then sampled at a rate of 14,400 samples per second, with the result that 240 samples are produced in each one-sixtieth of a second corresponding to a field period (circuit 155). Each group of 240 samples is first-stored in FIFO circuit 53, then collected in the random-access memory 61, to be read out of the memory in the following one-sixtieth of a second in a pseudo-random order. The process is continuous so that in each one-sixtieth of a second 240 new samples are collected in one section of the memory, while the 240 previous samples are read out from the other section of the memory. A completely different pseudo-random readout sequence is used for each group of 240 samples.

The samples are transmitted in analog form as part of the scrambled TV waveform. In the illustration of FIG. 9, each group of 240 samples is transmitted in one TV field at a rate of one sample per active TV line. Each audio sample is inserted at the beginning of a TV line, following the color burst (FIG. 8).

The effect of re-ordering the audio samples in an essentially random fashion is to convert the signal into a noise-like form that contains none of the frequency characteristics required for intelligibility. Typically, a 400 Hz sine wave input signal when processed would engender a noise-like signal which when the scrambled output samples are smoothed by a lowpass filter produces a continuous audio signal. The frequency spectrum of the noise-like signal is flat, which means that all frequencies are present up to the cut-off frequency of the smoothing filter, as would be the case with a wideband noise input signal.

Descrambling at an authorized receiver is accomplished by reversing the scrambling process. The samples are recovered from the received video and then stored in groups of 240 per field by a random-access memory. Pseudo-random addressing of the memory during the storage process restores the order of the samples in the memory to the original sequence. The descrambled audio is then obtained by reading the samples out of the memory in consecutive order and smoothing them in a lowpass filter.

There are three primary factors that contribute to the high level of security of this scrambling technique:

1. The minimal size of the signal elements that are interchanged. Individual signal samples, once out of sequence, provide little, or no information, about the original neighboring samples; there is no "slope" or other correlation information present.
2. The range of positional interchange is over a time period of one-sixtieth of a second. Consequently, any frequency component down to 60 Hz can be completely destroyed by the pseudo-random sample interchange.
3. The use of a completely different pseudo-random interchange sequence in each one-sixtieth of a second. This very greatly increases the difficulty of unauthorized descrambling by trial and error methods. If a given one-sixtieth of a second audio segment can be descrambled, no information is obtained about the correct sample sequence in other segments. More importantly, if several one-sixtieths of a second segments of audio have to be descrambled simultaneously in order to obtain a recognizable sound, the number of possible sample orders to be tried increases exponently with the number of segments.

One important feature of this scrambling technique is that the processing time delay required both for scrambling and descrambling is only one-sixtieth of a second, or 16.67 milliseconds. On a two-way satellite communication link the total loop delay due to scrambling and descrambling is 4×16.67 or 66.68 milliseconds. This is important because experiments have shown that two-way voice communication is impaired for total loop delays greater than 600 milliseconds. Since the round trip propagation time for satellite links is about 480 milliseconds, it is essential for this application that the processing delays for scrambling and descrambling be as small as possible.

Considering the signal-to-noise ratio enhancement according to the present invention, since the scrambled audio is transmitted in analog form as part of the video signal, the video channel signal-to-noise ratio applies to the audio signal as well. A typical video signal-to-noise (SNR) ratio that will yield a generally acceptable picture is: $SNR_{VIDEO}=40$ dB peak-to-peak/RMS. This ratio will be assumed to be used hereinafter. Converting the ratio to an RMS-to-RMS ratio for a sinewave audio signal yields:

$$SNR_{AUDIO} = 31 \text{ dB RMS/RMS}$$

Although this is a perfectly adequate SNR insofar as intelligibility is concerned, since noise may be quite noticeable in the quiet portions of audio signals, an SNR of 48 dB or higher may be desirable for comfortable listening.

The invention provides for multiplying the amplitudes of low-level audio signals in the scrambler, and then dividing the amplitudes of the received signals by the same factor in the descrambler. This returns the signal to the correct amplitude while at the same time reducing the amplitude of any noise added in the transmission by the same dividing factor.

Thus, the amplitudes of all of the 240 samples of a particular TV field are multiplied by the same binary factor before transmission. The largest binary multiplier (1, 2, 4, 8, 16, or 32) that does not cause any sample in the group to exceed the peak signal limits is used. Calculation of the maximum common multiplier is accomplished first by adjusting the deviations of the audio signal from its mean $M_1$ by reference to two limits $P_1$, $P_2$.

It is observed that the maximum multiplier k that can be used for a given sample group becomes quite evident once the signal amplitudes are in binary form. On the audio signal side, thus in the scrambler, for example, 9-bit quantizing is used, corresponding to 512 signal levels about a mean $M_1=256$, where $P_1=511$ and $P_2=0$, e.g., the digital range limits. The mean output signal from the quantizer, S, corresponding to a zero input signal level, is:

$$S = 256 = 100,000,000 \text{ Binary}$$

The signal amplitude that is to be multiplied is defined as the difference between the signal S and the mean $M_1$. If the signal before multiplication is $f(t) = [f(t)-M_1]+M_1$, the resultant signal after multiplication is $X = ]f(t)-M_1]K+M_1$ or:

$$X = (S-256)k + 256 \quad (1)$$

where
 X = amplitude-multiplied signal sample
 S = input signal sample
 K = MAX of 1, 2, 4, 8, 16, 32 such that $0 \leq X \leq 511$
If, for example, $$S = 266 = 100,001,010$$

the amplitude is $+10 = 000,001,010$
From the binary representation of 266 it is evident that the amplitude 1010 can be shifted four places to the left to produce $$X = 110100000 = 416$$
$$= 256 + 160$$
$$= 256 + 16 \times 10$$

Each shift to the left by one bit position multiplies the amplitude by 2, so four shifts to the left correspond to a multiplication by 16. This is the largest permissible binary multiplier for an amplitude of 10. For signal amplitudes less than the mean the process is similar, but since the amplitudes are negative the maximum multiplier is determined by the number of "ones" in the most significant bit positions. For example, if S=246, the amplitude is −10 and the multiplier is 16 again:

$$S = 246 = 0111101\,10$$

SHIFT FOUR PLACES TO THE LEFT $$X = 96 = 001100000$$
$$= 256 - 160$$
$$= 256 + 16 \times (-10)$$

The process of division in the descrambler is just the reverse of the multiplication process. The following two examples illustrate amplitude division by 8, which requires a shift to the right of 3 bit-positions:

Example (1): $X = 368 = 101110000$
$\div 8$
$S = 270 = 100001110$
$= 256 + 14$
CHECK: $256 + 8 \times 14 = 256 + 112 = 368$
Example (2): $X = 125 = 010011000$
$\div 8$
$S = 243 = 011110011$
$= 256 - 13$
CHECK: $256 - 13 \times 8 = 256 - 104 = 152$ It is evident that the correct divisor must be transmitted to the descrambler for use with the associated audio samples. Since the same divisor is used for all of the 240 samples in one field, only one divisor per TV field is required. The divisor is transmitted as a 3-bit code in the vertical retrace interval of each field. The code is given in Table 1:

TABLE 1 DIVISION CODE

| Code | Divisor |
|---|---|
| 000 | 1 |
| 001 | 2 |
| 010 | 4 |
| 011 | 9 |
| 100 | 16 |
| 101 | 32 |

Before transmission, the divisor code is scrambled by adding to it, modulo-2, three binary digits from the random code generator. The resulting secure code is then transmitted as part of the vertical interval data that is transmitted to synchronize the random code generator in the descrambler.

The amplitude-multiplied samples are gated into the video signal for transmission while both signals are in digital form. The audio samples are first to be adjusted to fit into a peak-to-peak ($P'_1$, $P'_2$) video signal range which conditions the communication channel, since the level cannot be higher than the white ($P'_1$) nor lower than the black ($P'_2$). It should also be considered that the video is received with 8-bits, rather than 9-bit for the audio, in this instance. With #255 for the maximum white ($P'_1$) and 87 for the black ($P'_2$) the range is 168 which has to be related to the digital range of 511. If $(168/511)=(2.1/64)$, the required transformation is:

$$V = \frac{21}{64} X + 87 \quad (2)$$
$$= \frac{21}{64} [(S - 256)k + 256] + 87$$

where

V is an 8-bit number that can be gated directly into the digital video signal

X is the 9-bit amplitude-multiplied signal,

S is the direct 9-bit audio sample, assuming 87 to be the mean $M_2$ for the video channel transmission between peak white $P_1$ and peak black $P_2$.

The scale factor 21/64 reduces the peak-to-peak audio range to the peak-to-peak video range. The bias shift of +87 centers the audio signal so that it does not exceed the peak white video level or go below the black level.

In the descrambler, the bias shift must be removed prior to dividing the received audio amplitudes by k. However, in addition to the bias shift inserted at the scrambler, there may be an unintentional shift due to a difference between the DC levels of the video signal in the descrambler and the scrambler. To enable an accurate removal of the bias shift by the descrambler, a pulse set to the mean audio signal level $M_2$ is inserted by the scrambler as the first audio sample in each TV field. This increases the number of audio pulses per field to 241. The mean level, $M_2^-$, that is inserted can be calculated from equation (2) by setting S equal to 256:

$$V = (21/64)[(256-256)k + 256] + 87$$

$$V = 171, \text{ which is also: } (255+87)/2 = 171$$

If in the descrambler the value of V is determined by measurement of the first audio pulse in each TV field, this pulse need not be included in the decoded audio. The measured value can be higher or lower than 171, depending on the relative DC levels in the scrambler and the descrambler. The calculation performed in the descrambler, using the measured value of V, is:

$$S = (1/N)(V - \overline{V}) + 256 \quad (3)$$

The mean level of the amplitude-divided audio is set to 256, since the output signal is quantized to 512 levels. The 21/64 scale factor introduced in the scrambler is not removed by digital processing in the descrambler since it can be compensated for more simply by additional linear amplification.

The audio scrambler samples the input audio signal 240 times in each TV field period and stores the samples in order into a memory. The samples that are stored in one field period are read out in the next field period in a random order and transmitted at a rate of one per active TV line.

As shown in FIG. 9, the audio signal from line 55 is bandwidth limited to frequencies below 6 kHz and is sampled at a rate of 14.4 kHz. The audio sampling clock is generated by means of the phase-locked loop PLL driven from a 7.16 MHz clock. This clock signal can be generated within the video scrambler if the system provides for video scrambling. Such clocking arrangement produces exactly 240 audio samples during each TV field period. The samples are converted from analog form to 9-bit digital words which are stored initially in the first-into, first-out memory (FIFO circuit 53). Circuit 53 acts as a buffer between the input samples and the remainder of the scrambling system. The samples are processed at TV line rate during the active lines of each TV field period.

The readout of audio samples from circuit 53 is controlled by microprocessor (100) by means of a clock pulse on line 92 from Port #3. Typically, microprocessor 100 is a Signetics 8×300 device. The microprocessor uses the H-pulse of line 121 (derived from Video line sync) and the Vertical Interval signal of line 127, as timing references. The H-pulse triggers the 5 μsec. Monovibrator 122 which produces on line 125 a "Beginning of Line" signal to Port #2. The presence of this signal on line 125, in the absence of a Vertical Interval signal on line 127, indicates to the microprocessor an active video line.

In general, at the beginning of an active line the microprocesor clocks a sample out of the FIFO circuit 53 and, via the Write Enable signal of line 166 from Port #3, loads the sample into the RAM (Random Access Memory) 16. The output of the 50 μsec. Monovibrator 123 holds data selector 175 in the B mode, so that the RAM is addressed by the Sequential Counter 151 during loading of each sample from the FIFO circuit 53. The Sequential Counter 151 is reset on line 159 by the Vertical Rate pulse from the video scrambler, so that sequential addressing can start at zero at the beginning of each TV field period. Sequential counter 151 is advanced by the microprocessor via line 161 by one count near the end of each active line until, at count 239, the 240th sample is loaded into RAM 61.

Each sample from FIFO 53 is also loaded via line 59 into the microprocessor, via Port #1. In accordance with the teachings of the aforementioned copending application, the microprocessor determines the maximum amplitude multiplier for noise reduction. When all of the 240 samples have been evaluated, the microprocessor contains a list (in symbolic form) of all the multipliers that are applicable to one, or more, of the 240 samples. For example, if multipliers 4, 16, and 32 are in the list, this indicates that all of the 240 sample amplitudes in RAM 61 can be multiplied by 4, while some can be multiplied by 16 and some by 32. Since the smallest multiplier is 4, in this instance, it is the multiplier applicable to all the samples. It is 4 which is retained for use during the sample multiplication process. The multiplication takes place in the microprocessor during the read-out of the samples from RAM 61.

Although the RAM has 1024 locations of 9-bits, it is actually divided into two memory sections using only 240 locations in each section. The sections are used alternately. During each field period, one memory section stores 240 samples in sequence, while 240 samples are being read-out in pseudo-random order from the other memory section. The most significant bit (MSB) in the RAM address, which appears on line 165', is used to switch RAM 61 between the two memory sections. The output of the 50 μsec. Monovibrator 123 goes to Exclusive-OR device 152 together with the output of the Field period flip-flop 155 to produce the MSB address bit of line 165'. In each active video line period, one sample is written into the memory section which has been selected during the 50 μsec. pulse. After this, the other memory section is selected for writing and one sample is read out from the first one. The effect of the field period signal on lines 157 and 165, which reverses at field rate (see curves (h) (i) of FIG. 10) is to interchange the two memories at field rate. Thus the memory section written into during one field period is read-out during the next, etc.

The pseudo-random addresses used in reading out samples from RAM 61 are determined by pseudo-random numbers which are assumed to be generated in a random-code-generator used for video scrambling. The random code numbers are fed by line 71 into Random Address Counter 72. At the beginning of each video line, the count of the Random Address Counter 72 is preset to the current 8-bit pseudo-random number from the video scrambler. The counter output addresses two 256×1 bit Address Memories 76, 77 and a Random ROM 174 that, in turn, addresses RAM 61 through Data Selector 175 when the latter is the A mode (curve (f) of FIG. 10). The Random ROM 174 contains the numbers 0 to 239 arranged in a randomly selected sequence. When addressed by the Random Address Counter 72 the ROM merely interchanges each address in the range 0 to 239 with another address in the same range. This totally dissociates the audio scrambling code from the video scrambling code.

The two Address Memories 76, 77 are used, as aforesaid, to prevent any pseudo-random read-out address from being used more than once in a given field period. Since they have 256 locations, a detector 170 is used to reset circuit 72 when 240 locations have been used. The 8-bit numbers that are preset (see curve (c) in FIG. 10) into the Random Address Counter 78 are essentially random, and consequently there is nothing to prevent any particular number from occurring several times during the read-out of 240 samples from RAM 61. If this happened, one or more samples stored in the RAM would be read out several times, while other samples would not be read out at all. To prevent this, a record is kept in the Address Memories 76, 77 of each address used to read-out a sample. These Address Memories are used alternately, one in one field period, the other in the next field period. The data inputs to the two memories are provided by the complementary outputs on lines 158, 156 of the Field Period flip-flop 155. The record is kept by storing a "1" at each address that is used for accessing a sample from the RAM. After a sample has been read from RAM 61 into Port #5 by microprocessor 100, a Write Enable signal is sent via line 160 to clock both Address Memories, via Port #3. Consequently, a "1" is written (on line 158 for instance) into the active memory, while a "0" is (on line 156 in this case) written into the inactive memory. Thus, as the active Address Memory is gradually being filled during the RAM read-out process, the alternate Address Memory is being cleared for use in the next field period.

When the Random Address Counter 72 is preset (curve (c) of FIG. 10) to an address that has been used previously in the same field period, the active Address Memory opens AND Gate 86, thereby permitting the 7.16 MHz clock to advance via line 87 the Random Address Counter 72 to the next address. Clocking continues until an unused address is reached. The Address Memory, then, closes AND Gate 86.

The process of searching for the next random address is initiated by the microprocessor during the 5 μsec. "Beginning of Line" signal on line 125 (curve (d) of FIG. 10). The Write Enable signal of line 166 that stores a sample from FIFO circuit 53 in RAM 61 also initiates by line 95 the address search by setting Random Search flip-flop 96. This removes an inhibit signal from AND Gate 86, which permits clocking of the Random Address Counter 72 by the 7.16 MHz clock signal of line 88.

During clocking of the Random Address Counter 72, the address may be advanced beyond 239 into the 240 to 255 range. Also the counter may be preset initially to a count beyond 239. Since there are no samples stored outside of the 0 to 239 range of the RAM, an out-of-range Detector 170 is used to reset the Random Address Counter to zero; the search then continues for a valid, unused address.

The maximum search time required to locate a valid address is 357 μsec. The remainder of the 50 μsec. delay can therefore be used by the microprocessor in each active TV line period as an indication that the RAM is addressed by a valid address. A sample is then read (see curve (g) in FIG. 10) into the microprocessor via Port #5 and Port #2. The amplitude of each sample is, there, multiplied by the multiplier which has been determined from the group of 240 samples as it was stored into the RAM during the previous field period. Each multiplied sample is outputted through Port #4 to the Audio Output Latch 102, where it is held for insertion at the beginning of the next video line.

Figure 11A:
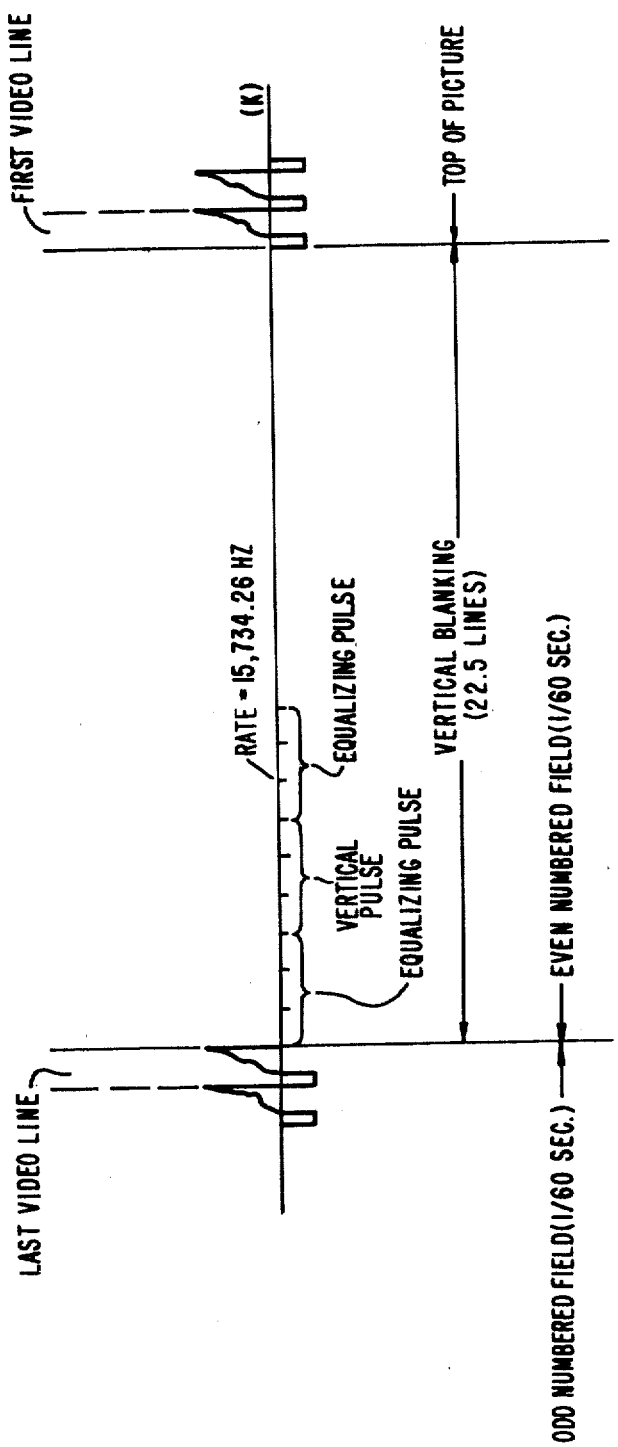
FIGS. 11A and 11B show, at television field scale, the timing of the insertion process.
Figure 11B:
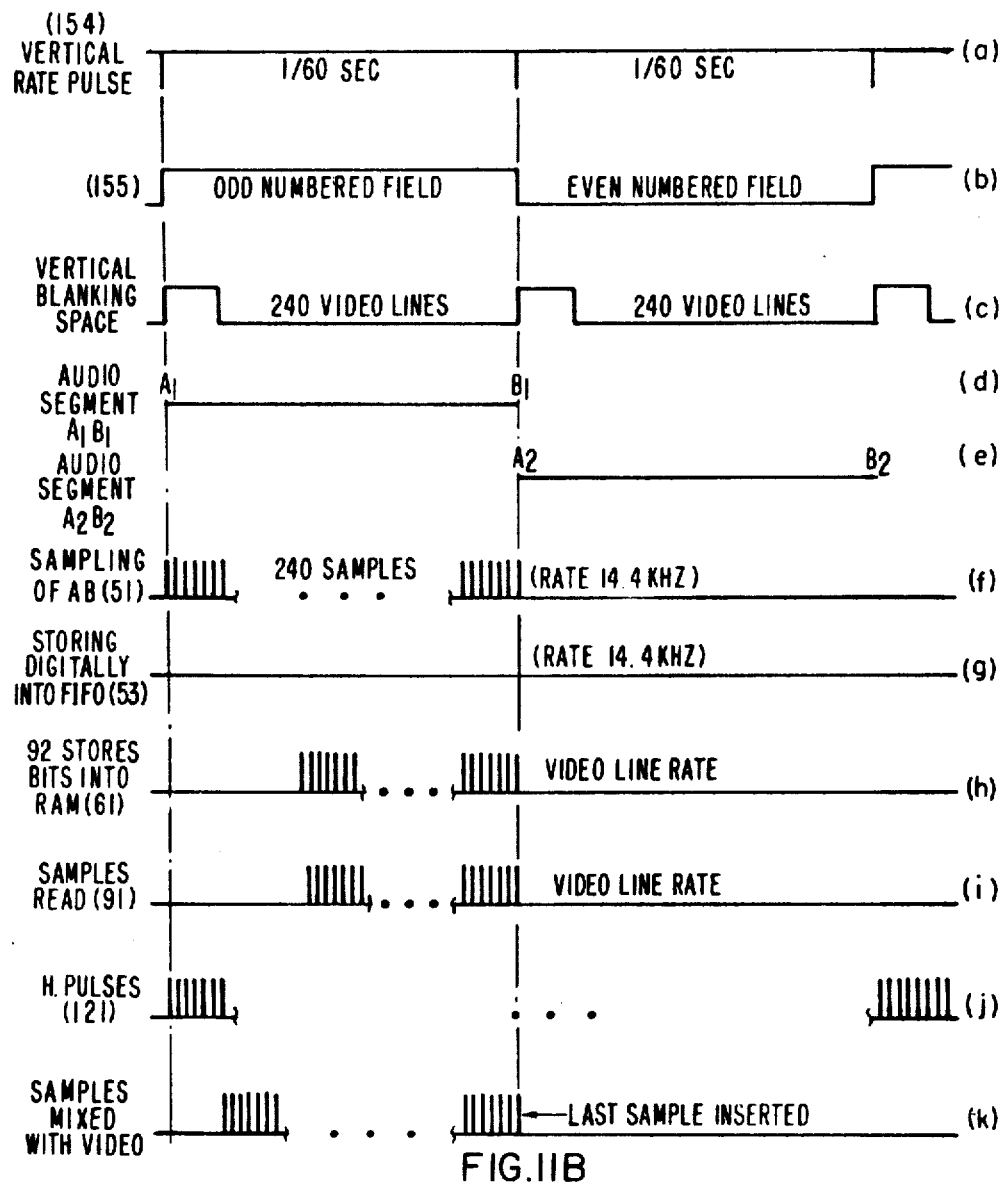

While FIG. 10 shows with curves by reference to an H-pulse, the sampling and scrambling process at the scale of the video lines, FIGS. 11A and 11B show the overall process at the scale of the video frames for successive audio segments AB and A'B', each 1/60 sec. long. FIG. 11A shows the vertical blanking space. FIG. 11B shows two successive fields of a video frame. The operative steps are readily recognized from a consideration of the steps of FIG. 10 and the explanations already provided.

The insertion of one digital sample in a video line will now be considered by reference to lines 105 and 146 of FIG. 9 and to the block diagram of FIG. 12 which shows the interface between the video lines to be transmitted and the audio sample to be inserted. Referring to FIG. 12, sync separator 22 detects the horizontal pulse from the video signal of line 21, which triggers a horizontal pulse generator 24 providing on lines 28 and 121 the H-pulse signal of FIG. 9. The H-pulse is shown inputted via line 121 into the 9 ms. timer of FIG. 9 providing one input to AND device 144 on line 146 the Insert Audio Sample Signal of FIG. 9. Signal VERT which determines the vertical blanking space of FIG.

11A is, as generally known, derived by counting at the video lines in a video frame defined by frame pulse generator 26. Counter 30 is inputting into four detectors: 32 detects line 522, 33 detects line 17, 34 detects line 259, and 35 detects line 280. Flip-flops 36 and 37, associated with the first and second pair of detectors, go into OR device 44 to generate the blanking space pulses VERT on line 45 which after inverting to VERT are gating on line 145 AND gate 144.

The video signal of line 21 is converted into digital by A/D converter 47. The insertion of the audio samples into the outgoing video lines is effected digitally. The timing is determined by counting cycles of the 7.16 MHz clock from the beginning of each video line (H-pulse). The audio sample from line 105 is inserted in response to signal 146 switching a data selector 31 from the 8-bit video signal of line 48 to the output 105 of the Audio Output Latch 102. The audio sample is converted from digital-to-analog form, along with the video signal, in the video D/A converter 38. At count 142 by detector 138 FF1 Timer flip-flop 131 and FF2 Timer flip-flop 141 are reset to end the audio insertion. The window for insertion of an audio sample has a duration of approximately 2 $\mu$sec., which provides a margin of error for locating the samples in the descrambler of approximately $\pm 0.5$ $\mu$sec.

Two additional signals are also inserted in the scrambled video signal.

One is the multiplier factor K, which is transmitted as a 3-bit code along with the video synchronization information. It is inserted during the vertical interval immediately preceding the active TV lines containing the audio samples that are multiplied by the factor K. The 3-bit code representing the multiplier is transferred from the microprocessor via Port #4 to the Multiplier Code Latch 130, from where it is automatically inserted via line 106 by means of a conventional circuitry within the video system.

The other additional signal is an artificial audio sample, generated by the microprocessor, and set to the mean audio signal level $M_2$ (171 if the range is from 0 to 255). Transmission of this reference-level sample is possible because there are actually 242 active TV lines in each field, thus two more than the number of lines used for insertion of an audio sample. The first active line in each field is not used for audio transmission. When this is the case, the Insert Audio signal of line 146 is blocked by an inhibit signal appearing on line 145 from the microprocessor thus blocking the AND Gate 144. The second active line is used to transmit the reference-level sample $M_2$ in the same way as any of the audio samples.

In essence the audio descrambler reverses the process used in the scrambler, where audio samples are written into a memory in sequence and then read out in pseudo-random order. In the descrambler, after the samples are recovered from the received scrambled TV waveform, they are written into a memory in pseudo-random order and then read out in sequence. This returns the samples to the correct sequential order to produce the descrambled audio signal.

Figure 13:
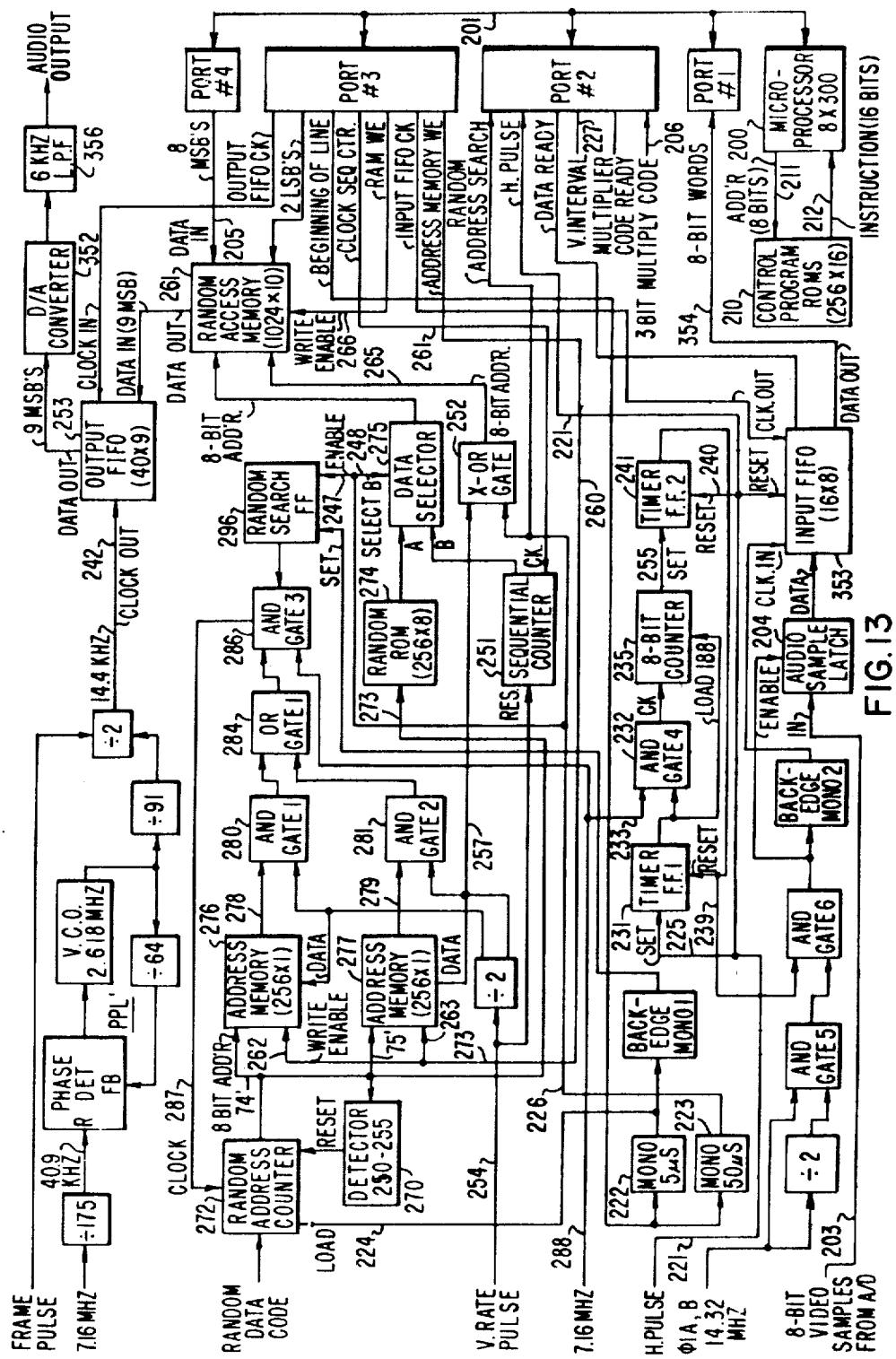
FIG. 13 is the audio unscrambler as applied at the receiver side of the television system in correlation with the audio scrambler of FIG. 9.

FIG. 13 is a block diagram of the audio descrambler which at the receiver side of the television system corresponds to the audio scrambler of FIG. 9 for the transmitter. Blocks which indicate a similar function in the reverse process have been given, wherever possible, the same reference numeral raised by 200 where the reference numeral of FIG. 9 has one or two digits, raised by 100 where it has three digits. Thus, the equivalent of the Random Address Counter 72 is now 272, of the Random Access Memory 61 becomes 261, of vertical rate pulse line 154 is 254, and so on.

An understanding of the circuit of FIG. 13 is straight forward in the light of the explanations given for the audio scrambler circuitry of FIG. 9. Some original features in the audio unscrambler should, however, be mentioned as follows:

The invention provides for a two-step process to improve the SNR of the received audio signal. At the receiver end, an integration is performed in order to improve the SNR from 31 DB to 40 DB. This integration is performed digitally, using the output of the video A/D converter in the descrambler. Eight signal samples, taken at a 7.16 MHz rate, are added in an 8×300 microprocessor. This is equivalent to reducing the receiver noise bandwidth for the audio signal from 4 MHz to 0.5 MHz, thereby reducing the noise power by 9 dB. This operation is centered around the timer section and input FIFO memory 353 of FIG. 13.

In the audio descrambling system of FIG. 13, the input signal consists of 8-bit video signal samples, at a 14.32 MHz data rate which are derived on line 203 after conversion to digital form (the A/D converter is not shown). The video samples that represent the audio pulse on each active video line are located at the exact time by means of a digital timer. The timer section comprises circuit elements 222, 223, 231, 232, 235 and 241. They are very similar to those of the timer in the audio scrambler of FIG. 9. The timer starts at the H-pulse and counts 67 cycles of the 7.16 MHz clock of line 288 then initiates the loading of input signal samples.

In the audio descrambling system of FIG. 13, the input signal consists of 8-bit video signal samples, at a 14.32 MHz data rate which are derived on line 203 after conversion to digital form (the A/D converter is not shown). The video samples that represent the audio pulse on each active video line are located at the exact time by means of a digital timer. The timer section comprises circuit elements 222, 223, 231, 232, 235 and 241. They are very similar to those of the timer in the audio scrambler of FIG. 9. The timer starts at the H-pulse and counts 67 cycles of the 7.16 MHz clock of line 288 and then initiates the loading of input signal samples.

Alternate samples are latched into an Audio Sample Latch 204 by means of a properly timed 7.16 MHz clock. Each latched sample is then transferred to an Input FIFO (first-in, first-out memory) circuit 353. In each active video line, the Input FIFO circuit 353 stores the video samples representing the received audio pulse until they can be processed by the microprocessor. It automatically blocks out further inputs when it is full.

As a result, 16 samples are selected from the 920 samples scanned at a 14.32 MHz rate along the video signals, which coincide in time with the passing of the inserted audio sample within the window defined by the timer section. Of these 16 samples, the microprocessor retains only one of every two. Thus, the microprocessor 200 individually clocks eight video samples (representing one audio sample) out of the Input FIFO circuit 353, by line 354, into Port #1. Then, they are processed by the microprocessor. The eight samples are summed up and divided by eight. This improves the signal-to-noise ratio of the received sample. The first such audio sample received in each field is the reference signal set to the mean audio signal level. This particular signal is stored in the microprocessor and is used, before dividing the amplitudes of the following audio samples. The divisor that is used is specified by the 3-bit multiplier code which had been transmitted. A new multiplier code applicable to a new segment of audio is loaded into Port #2 of the microprocessor during each vertical interval. A "Multiplier Code Ready" signal is supplied to the microprocessor via Port #2 to initiate the loading of each multiplier.

The search for a pseudo-random address for the Random Access Memory (RAM) 261 proceeds in parallel with the integration of the input video samples and the amplitude division process in the microprocessor. The pseudo-random addresses are generated in exactly the same manner as for the audio scrambler of FIG. 9. The random code generator typically is one used in a video descrambler. It is synchronized with the generator in the associated video scrambler and so produces an identical sequence of numbers. Using these numbers as starting points, the audio descrambler generates a sequence of pseudo-random addresses that are identical to those generated in the audio scrambler. The microprocessor 200 uses the end of the 50 $\mu$sec. period derived from monovibrator 223 on line 226, as an indication that a valid pseudo-radom address has been found in each active video line. The microprocessor then loads a processed audio sample, via Port #4, and line 205, into RAM 261 at the selected address. Since the address is the same address that was used in the scrambler to read the sample from a RAM, this process returns each sample to its original sequential order within RAM 261.

Like in the audio scrambler of FIG. 9, RAM 261 is operated as two separate 240 sample memories. In each field period, while one memory is loaded with 240 samples using pseudo-random addresses, the second memory is read out sequentially. RAM 261 is addressed by a Sequential Counter 251 during the 50 $\mu$sec. delay period, and the microprocessor clocks (via Port #3) one sample from the RAM into Output Memory (FIFO) circuit 253 at the beginning of each active video line. The samples are clocked into circuit 253 at line rate and are clocked out at a uniform rate of 14.4 kHz. Again, this is just the reverse of the process used in the audio scrambler of FIG. 9.

The output clock on line 258 is generated by means of a phase-locked loop PLL in exactly the same way that the input FIFO clock of line 58 is generated in the audio scrambler of FIG. 9. The 9-bit samples from the Output FIFO circuit 253 are converted into analog by a D/A converter 352, and the output is lowpass filtered at 356 to recover the original baseband audio signal.

More than one audio signal may be transmitted, and/or it is provided for the transmission of more than one audio sample inserted in each video line. For these embodiments, the following considerations apply:

The first consideration in extending the current signal secure audio channel system to two or three secure channels is the format of the scrambled output signal. The most direct approach consists in adding one additional audio pulse on each active TV line for each additional audio channel; this format is illustrated in FIG. 14 by curve (a).

This arrangement, however, could result in crosstalk between the audio channels because of the limited time available on each line, for audio pulses. Typically, the single-channel audio system just described uses approximately 2 $\mu$sec. for the single audio pulse on each active line. This allows for 1 $\mu$sec. of pulse integration at the receiver to improve the signal-to-noise ratio, and ±0.5 $\mu$sec. for positional tolerance. The line time available for audio pulses consists of part of the line blanking period and part of both ends of the active line period. The ends of the active line can be deleted because they are not seen due to overscanning on TV monitors. The maximum time that can be used for audio is about 3 $\mu$sec., since 1.5 $\mu$sec. are already used for repeating video samples in the scrambled video waveform. If 1 $\mu$sec. audio pulses are used in a three-channel system, the receiver integration time will probably have to be cut to 0.5 $\mu$sec., and the pulse positioning requirements will be quite critical if crosstalk is to be avoided.

Figure 14:
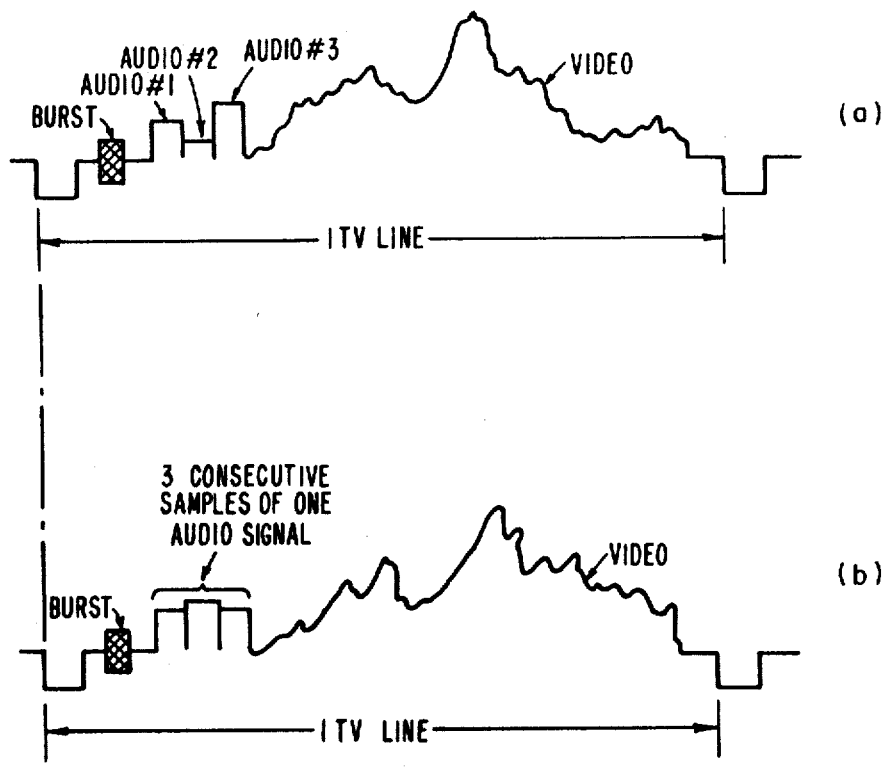
FIG. 14 shows with curves two modes of inserting three audio samples into a video line.

The crosstalk problem can be avoided by the format indicated by curve (b) of FIG. 14. Here each active TV line carries three consecutive samples (for a three-channel system) of only one of the audio signals. This format can be produced by using a pseudo-random address to locate the first sample in the RAM and then following it with the next two samples in sequence.

With this format, any crosstalk between samples is equivalent to a small reduction in bandwidth and will not affect intelligibility. This is true for crosstalk caused by timing errors in the descrambler as well as for signal transient effects. If, for example, eight video samples are integrated in the descrambler to form one audio sample, a timing error might result in six video samples from one of the input audio pulses being added to two video samples from an adjacent audio pulse. Since contiguous samples are usually similar in amplitude, this crosstalk would have little effect except for some attenuation of the highest audio frequencies.

There are different ways in which the audio samples can be interlaced in the TV field with this format. One is simply to alternate the audio signals; that is, one active line contains three samples of audio #1; the next line, three samples of audio #2; the next line, three samples of audio #3, etc. A second way would be to divide each TV field into three audio fields; the first 80 lines carry 240 samples of audio #1, the second 80 lines carry 240 samples of audio #2, etc.

Figure 15:
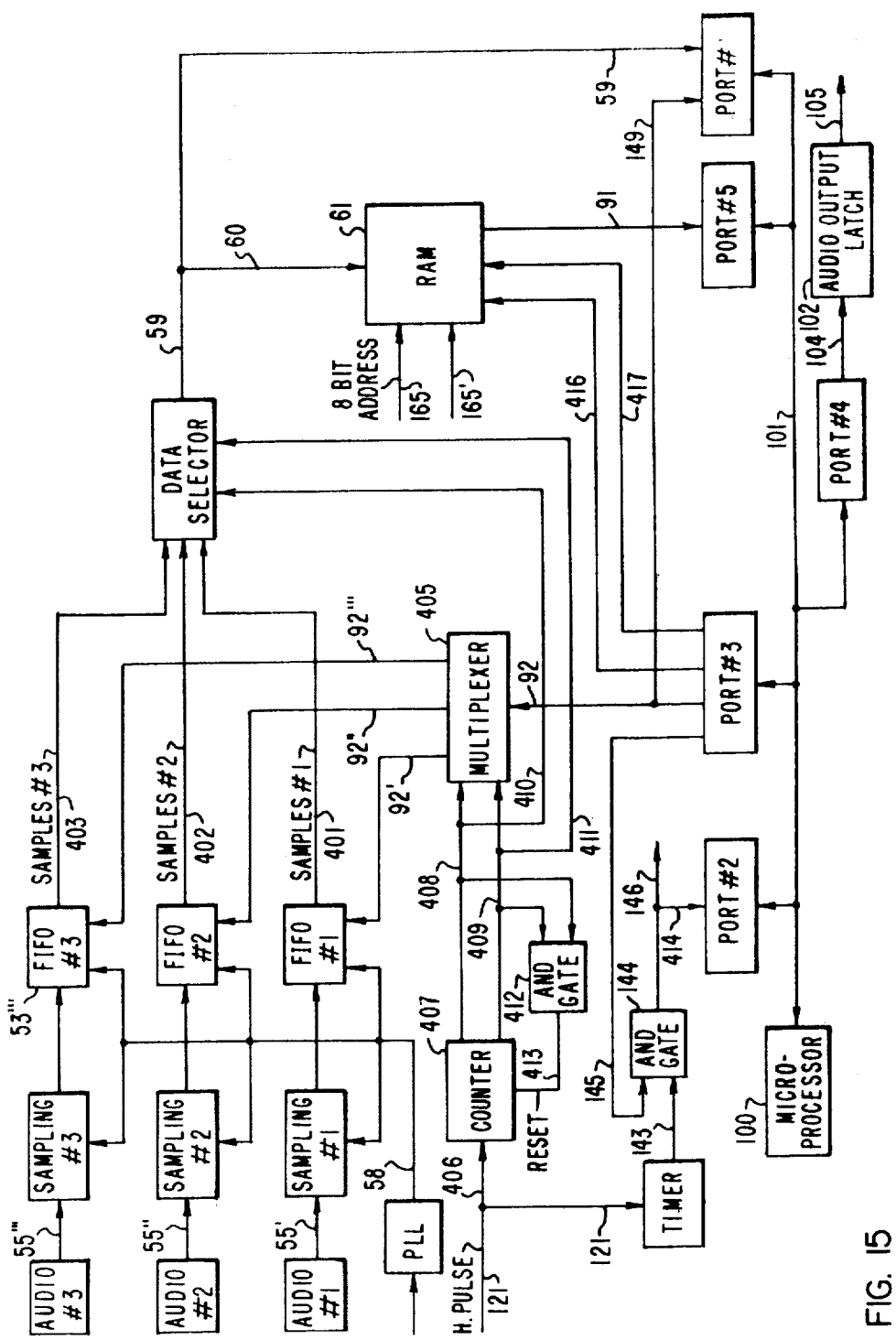
FIG. 15 shows circuitry used in the context of FIG. 14 for inserting three consecutive audio samples into one video signal, where three audio sources are to be transmitted.

Referring to FIG. 15, a block diagram shows how the circuit of FIG. 9 can be modified for the insertion of three consecutive samples, with three audio sources providing three different continuous audio signals.

Figure 16:
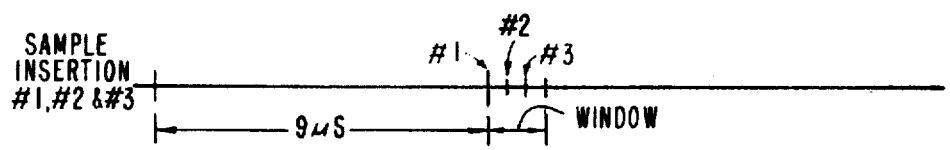
FIG. 16 shows the timing of the command signals used in FIG. 15 for the insertion of three consecutive samples.

Referring to FIG. 15, circuitry is shown for storing audio samples into RAM 61 from three different audio sources, Audio #1, Audio #2 and Audio #3, and for deriving three consecutive samples of each audio source into RAM 61, each triplet of samples being inserted after scrambling the sequence of triplets in an occurring video line after latching into audio output latch 102 and when insertion is triggered by line 146. Only relevant portions of the circuitry of FIG. 9 have been shown in FIG. 15. All circuit elements relative to the timer section have been, for the sake of clarity, represented by one block responsive to the H-pulse of line 121 and outputting the proper 9 microsecond delayed signal on line 143 to AND Gate 144. The microprocessor is shown with the data bus 101 and all its Ports. The distinctive portions are as follows:

The three audio sources are sampled by respective sampling circuits, each equivalent to the combination of sample and hold circuit 51 and A/D converter 52 of FIG. 9. The sample clock contains the phase locked loop PLL and is the same as in FIG. 9, being common to the three audio channels. This clock also controls three FIFO circuits 53', 53" and 53'" which are the same as circuit 53 of FIG. 9. A data selector 404 derives three consecutive samples from one of the FIFO circuit in each successive positions corresponding to inputs 401, 402, 403, thereby to output three samples on lines 59 and 60 to Port #1 and to RAM 61 like in FIG. 9. The three positions of data selector 404 correspond to three successive video lines. These are defined by two bit lines 410, 411 from a 2-bit ring counter 407 triggered by the H-pulse. The ring counter establishes three successive states due to AND device 412 which in a feedback loop resets the counter after each succession of three states. A multiplexer 405 responds to three pulses on line 92 from the microprocessor (like in FIG. 9) to derive three control lines 92', 92'', 92''' for the respective FIFO's (instead of one per video line, or H-pulse, in FIG. 9). RAM 61 has been chosen to have 2048 locations capacity, thereby to allow 240 samples to be stored, or read-out, in a 256×4=1024 array with an eleven-bit address. The most significant bit (MSB) is on line 165' (like in FIG. 9), the 8-bit address defines the locations for storage or random read-out and the 2 additional bits are in fact the least significant bits. They are provided by the microprocessor on lines 416, 417 from Port #3 in order to identify the three consecutive samples of the current video line in each four locations of the operative 256×4 array. While insertion of the first sample takes place automatically when by line 146 the window is initiated. The microprocessor knows starting of the window nine microseconds from the H-pulse (see FIG. 16) by line 414 from line 146 to Port #2 and, therefore, it can clock twice more, by the bits of lines 165, 165', the insertion of two more samples (see again the window for insertion shown in FIG. 16).

Additional secure audio channels can be provided by using parallel-single-channel circuit boards. The only changes required are those required for the changed scrambler output signal format and for the descrambler input signal format. Most of these changes could be made in the instruction sequences controlling the 8×300 microprocessors.

A two-channel audio capability can be provided by time-sharing the single-channel circuitry. The analog-to-digital converter and digital-to-analog converter both are capable of operating at more than twice the current speed and could therefore be time-shared. The random access memory has exactly the capacity required for two audio channels. Both channels could use the same pseudo-random addressing. In this regard, it is assumed that the 8×300 microprocessor is fast enough to process two audio signals in each TV line period. It is therefore possible to have a two-channel audio capability with a negligible increase in circuitry.

The audio scrambler/descrambler according to the invention offers a channel bandwidth which is twice that of commercial audio scramblers and the degree of security attained is extremely high. The number of different sequences of audio samples that are possible in each TV field period is 240 factorial, or $4 \times 10^{486}$, a number so large that it effectively eliminates trial and error decoding. At the same time, the spectrum of the scrambled signal resembles that of random noise, so that neither time domain or frequency domain analysis appear to provide useful information for unauthorized decoding.

APPENDIX

8×300 Microprocessor Programs

The microprocessor instruction sequence for the audio scrambler of FIG. 9 is listed in Table 3, and for the descrambler of FIG. 13 is listed in Table 4. Details of the instruction set and the microprocessor architecture are given in Chapter "Microprocessor" pages 61-72 of the Signetics Data Manual (copyright 1976, Signetics Corporation, 811 East Arques Avenue, Sunnyvale, Calif. 94086). Reference to one of these is essential for understanding the instructions.

The code in the tables is 6-digit octal, but in the binary code used in the equipment the 2nd and 5th most significant octal digits are represented in binary code by only 2 bits. This results in 16-bit instructions. For example, Table 1, Code 9 in octal and binary is as follows:

| 6-Digit Octal: | 5 | 22 | 1 | 13 |
|---|---|---|---|---|
| 16-Digit Binary: | 101 | 10010 | 001 | 01011 |

The fourth column of the tables lists the 8-bit port that is involved in the operation specified by the instruction. There are five ports, denoted P1 to P5, with P1, P2, and P5 assigned to the "left bank" and P3 and P4 assigned to the "right bank". One port in each bank can be selected, that is, made active, at a time. The active port in each bank stays active until another port in the same bank is selected.

The eight individual input-outputs of each port are labeled 0, 1, 2, 3, 4, 5, 6, and 7. The notation P3, 7 refers to the seventh position of P3. The functions of the scrambler ports are listed in Table 1, and those of the descrambler ports, in Table 2.

TABLE 1

SCRAMBLER PORTS

| P1 | | < | 8 MSB from F1F0 |
| --- | --- | --- | --- |
| | | | P1, 7 is LSB |
| P2 | 0 | | |
| | 1 | < | Beginning of line |
| | 2 | < | Vertical Interval |
| | 3 | < | F1F0 data ready |
| | 4 | | |
| | 5 | | |
| | 6 | < | |
| | | | 2 LSB from RAM |
| | 7 | < | |
| P3 | 0 | > | Latch multiply code |
| | 1 | > | Clock Sequential Counter & Write Enable to address RAMS |
| | 2 | > | Insert Audio Enable |
| | 3 | > | Latch output data |
| | 4 | | |
| | 5 | | |
| | 6 | > | Write Enable to RAM and Start Address Search |
| | 7 | > | F1F0 clock, Port 1 BIC signal |
| P4 | | > | 8-bit output data to latch, 3-bit multiply code to latch |
| P5 | | < | 8 MSB from RAM |

TABLE 2

DESCRAMBLER PORTS

| P1 | | < | 8-bit input data from Input F1F0 |
| --- | --- | --- | --- |
| | | | P1, 7 is LSB |
| P2 | 0 | < | Random Address search in progress |
| | 1 | < | H. Pulse (beginning of line) |
| | 2 | < | Vertical interval |
| | 3 | < | F1F0 data ready |
| | 4 | < | Multiply code ready |
| | 5 | < | |
| | 6 | < | 3-bit multiply code |
| | 7 | < | |
| P3 | 0 | > | |
| | | | 2 LSB to RAM |
| | 1 | > | |

TABLE 2-continued

| | | DESCRAMBLER PORTS | |
|---|---|---|---|
| | 2 | > | |
| | 3 | > | Start random address search |
| | 4 | > | Load Output F1F0 |
| | 5 | > | Clock Sequential Counter |
| | 6 | > | Load RAM |
| | 7 | > | F1F0 Clock, Port #1 BIC Signal |
| P4 | | > | 8 MSB to RAM |
| P5 | | | not used |

TABLE 3

| SCRAMBLER 8 X 300 PROGRAM | | | | | | |
|---|---|---|---|---|---|---|
| Address | Description | Code | | | | Port |
| 0 | NOP | 0 | 00 | 0 | 00 | |
| 1 | NOP | 0 | 00 | 0 | 00 | |
| 2 | NOP | 0 | 00 | 0 | 00 | |
| 3 | 0>AUX | 6 | 00 | 0 | 00 | |
| 4 | SEL. P3 | 6 | 17 | 0 | 03 | 3 |
| 5 | AUX>P3 | 0 | 00 | 0 | 37 | 3 |
| 6 | SEL. P2 | 6 | 07 | 0 | 02 | 2 |
| 7 | NZT (B.Line) 9 | 5 | 21 | 1 | 11 | 2 |
| 8 | JMP 191 | 7 | 00 | 5 | 37 | |
| 9 | NZT (Vert.Int.) 11 | 5 | 22 | 1 | 13 | |
| 10 | JMP 12 | 7 | 00 | 0 | 14 | |
| 11 | MJP 159 | 7 | 00 | 4 | 37 | |
| 12 | NZT (Data Rdy) 14 | 5 | 23 | 1 | 16 | 2 |
| 13 | JMP 159 | 7 | 00 | 4 | 37 | |
| 14 | SEL. P3 | 6 | 17 | 0 | 03 | 3 |
| 15 | Clock F1F0 | 6 | 37 | 1 | 01 | 3 |
| 16 | NOP | 0 | 00 | 0 | 00 | |
| 17 | Clock F1F0 | 6 | 37 | 1 | 00 | 3 |
| 18 | NZT (B.Line) 18 | 5 | 21 | 1 | 22 | 2 |
| 19 | W.E.>RAM: R.Addr.Start | 6 | 36 | 1 | 01 | 3 |
| 20 | W.E.>RAM | 6 | 36 | 1 | 06 | 3 |
| 21 | Sel. P1 | 6 | 07 | 0 | 01 | 1 |

The meanings of the terms in the Description column of Tables 3 and 4 are explained by the following examples. The notations R3, R4, R6, etc., refer to 8-bit internal registers in the microprocessor:

| | |
|---|---|
| NOP | No operation |
| AUX | Internal register. Contains second term for all arithmetic operations. |
| SEL.P3 | Select port 3 |
| NZT (B.Line) 9 | Non-zero transfer: If Beginning of Line Signal is present, jump to address 9, else advance to next address in sequence. |
| JMP 191 | Jump to decimal address 191 |
| 101B>R4 | Load binary 101 in internal register R4 |
| Clock F1F0 | Output a logical 1 to the F1F0 |
| Clock F1F0 | Output a logical o to the F1F0 |
| XEC (Mult.Code)+1 | Execute instruction at address given by the sum of the multiply code, the current address, and 1. |
| Add R1, 4>R3 | Cyclicly shift contents of internal register R1 four positions to the right, add to AUX, and place in internal register R3. |
| 111B>P4, 7 | Place 111 binary in port 4 with least significant bit in position 7 of the port. |
| P4,7,5>R6 | Move 5 bits from port 4 with LSB from position 7, into R6. |
| XOR P1,7,0>R3 | Exclusive-OR 8-bits of port 1 (position 7 is LSB) with content of AUX and place in R3. |

I claim:

1. In a communication system including a transmitter, a receiver and a communication channel, a signal modifier apparatus associated with said transmitter comprising:
   sampler means responsive to an input signal to be transmitted through said communication channel for deriving a series of samples representative of a segment of said input signal;
   analog-to-digital converter means for converting each sample to a digital sample value;
   first means responsive to said digital sample values for subtracting a first predetermined digital value $M_1$ thereof to derive digital values representative of deviations of said input signal from said first predetermined value $M_1$;
   second means for determining with said digital values representative of deviations a common factor K with $K > 1$;
   third means for multiplying each of said representative digital values by said common factor K to derive corresponding amplified digital values;
   fourth means for adding a second predetermined digital value $M_2$ to each of said amplified digital values to derive corresponding augmented digital values;
   digital-to-analog converter means for converting said augmented digital values into an intermediary analog signal;
   said transmitter transmitting said intermediary analog signal through said communication channel.

2. The system of claim 1 with said first predetermined $M_1$ representing $(P1-P2)/2$, where P1 and P2 are respective upper and lower limits for said input signal.

3. The system of claim 2 with said second predetermined value $M_2$ representing $(P1'-P2')/2$, where $P1'$ and $P2'$ are representative of respective upper and lower limits for said intermediary analog signal.

4. The communication system of claim 3 with another signal modifier apparatus being associated with said receiver and comprising:
   another sampler means responsive to the received said intermediary analog signal for deriving a second series of samples;
   another analog-to-digital converter means responsive to said second series of samples for converting each sample to a digital sample value;
   fifth means responsive to said digital sample values of said second sample series for subtracting $M_2$ thereof to derive digital values representative of deviations of said intermediary analog signal from $M_2$;
   sixth means for dividing each of said deviation representative digital values by K as a common divisor;
   another digital-to-analog converter means for converting the divided digital values into an analog signal representative of said input signal.

5. The system of claim 4 with code signals respectively representative of K and $M_2$ being transmitted with said intermediary analog signal.

* * * * *